United States Patent
Takeshima et al.

(10) Patent No.: US 12,360,056 B2
(45) Date of Patent: Jul. 15, 2025

(54) SEMICONDUCTOR APPARATUS EXAMINATION METHOD AND SEMICONDUCTOR APPARATUS EXAMINATION APPARATUS

(71) Applicant: HAMAMATSU PHOTONICS K.K., Hamamatsu (JP)

(72) Inventors: Tomochika Takeshima, Hamamatsu (JP); Takafumi Higuchi, Hamamatsu (JP); Kazuhiro Hotta, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 392 days.

(21) Appl. No.: 17/604,000

(22) PCT Filed: Apr. 9, 2020

(86) PCT No.: PCT/JP2020/015982
§ 371 (c)(1),
(2) Date: Oct. 15, 2021

(87) PCT Pub. No.: WO2020/241083
PCT Pub. Date: Dec. 3, 2020

(65) Prior Publication Data
US 2022/0221411 A1    Jul. 14, 2022

(30) Foreign Application Priority Data
May 31, 2019  (JP) ................ 2019-102283

(51) Int. Cl.
*G01N 21/95* (2006.01)
*G01N 21/88* (2006.01)

(52) U.S. Cl.
CPC ..... *G01N 21/9501* (2013.01); *G01N 21/8851* (2013.01)

(58) Field of Classification Search
CPC ................ G01N 21/9501; G01N 21/8851
See application file for complete search history.

(56) References Cited

U.S. PATENT DOCUMENTS

2002/0005945 A1* 1/2002 Isozaki ............. G01N 21/9501
356/237.2
2002/0185585 A1* 12/2002 Jutte ................... G11B 7/131
(Continued)

FOREIGN PATENT DOCUMENTS

CN     109804259 A    5/2019
EP       3951846 A1    2/2022
(Continued)

OTHER PUBLICATIONS

Machine translation of JPH11304483 A (Year: 1999).*
(Continued)

*Primary Examiner* — Lee E Rodak
*Assistant Examiner* — Sangkyung Lee
(74) *Attorney, Agent, or Firm* — Faegre Drinker Biddle & Reath LLP

(57) ABSTRACT

A semiconductor apparatus examination method includes a step of acquiring a first interference waveform based on signals from a plurality of drive elements according to light from a first light beam spot including the plurality of drive elements in a semiconductor apparatus, a step of acquiring a second interference waveform based on signals from the plurality of drive elements according to light from a second light beam spot having a region configured to partially overlap the first spot and including the plurality of drive elements, and a step of separating a waveform signal for each of the drive elements in the first and second spots based on the first and second interference waveforms.

20 Claims, 35 Drawing Sheets

(56) References Cited

U.S. PATENT DOCUMENTS

| | | | |
|---|---|---|---|
| 2010/0231253 A1* | 9/2010 | Kitagawa | G01N 21/95607 |
| | | | 324/97 |
| 2011/0280468 A1 | 11/2011 | Song et al. | |
| 2012/0097848 A1 | 4/2012 | Lifshin et al. | |
| 2012/0307249 A1* | 12/2012 | Nakamura | G01N 21/88 |
| | | | 356/450 |
| 2015/0323313 A1* | 11/2015 | Aiyer | G01B 11/2441 |
| | | | 356/503 |
| 2015/0369755 A1 | 12/2015 | Nakamura et al. | |
| 2015/0377959 A1* | 12/2015 | Nakamura | G01R 31/2656 |
| | | | 324/754.23 |
| 2018/0128869 A1 | 5/2018 | Nonaka | |
| 2019/0121155 A1 | 4/2019 | Yu et al. | |
| 2021/0373071 A1* | 12/2021 | Shimase | G01R 31/2601 |

FOREIGN PATENT DOCUMENTS

| | | | |
|---|---|---|---|
| JP | H11304483 A | * | 11/1999 |
| JP | 2007-064975 A | | 3/2007 |
| JP | 2010-271307 A | | 12/2010 |
| JP | 2018-072290 A | | 5/2018 |

OTHER PUBLICATIONS

International Preliminary Report on Patentability mailed Dec. 9, 2021 for PCT/JP2020/015982.
Office Action dated Aug. 11, 2023 that issued in U.S. Appl. No. 17/606,829.

* cited by examiner

Fig.20

(a) WAVEFORM OF ELEMENT a +LIGHT EMISSION WAVEFORM — EWa (b) WAVEFORM OF ELEMENT b +LIGHT EMISSION WAVEFORM — EWb (c) WAVEFORM OF ELEMENT c +LIGHT EMISSION WAVEFORM — EWc (d) WAVEFORM OF ELEMENT d +LIGHT EMISSION WAVEFORM — EWd

Fig.35
(a) 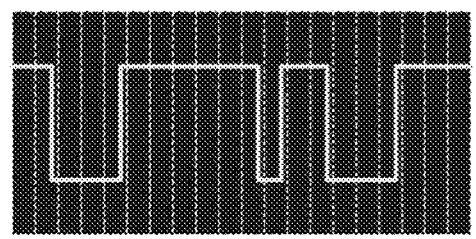
(b) 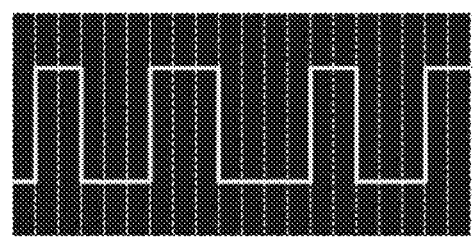
(c) 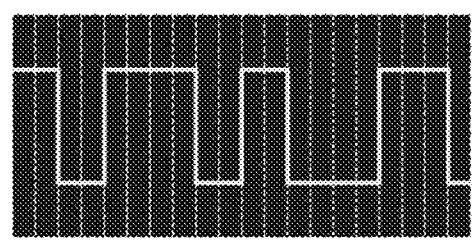
(d) 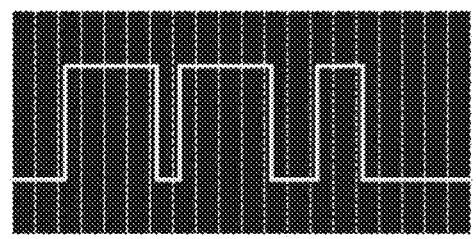

SEMICONDUCTOR APPARATUS EXAMINATION METHOD AND SEMICONDUCTOR APPARATUS EXAMINATION APPARATUS

TECHNICAL FIELD

One aspect of the present invention relates to a semiconductor apparatus examination method and a semiconductor apparatus examination apparatus.

BACKGROUND ART

As a technique for examining a semiconductor apparatus, optical probing techniques called electro optical probing (EOP) and electro-optical frequency mapping (EOFM) are known (refer to, for example, Patent Literature 1 and Patent Literature 2). In the optical probing techniques, the semiconductor apparatus is irradiated with light emitted from a light source, reflected light reflected by the semiconductor apparatus is detected by an optical sensor, and a detection signal is acquired. Then, in the acquired detection signal, a time change of the signal is displayed as a waveform, a target frequency is selected, and a time course of amplitude energy is displayed as two-dimensional mapping. Thus, it is possible to determine whether an operation of a specified location is normal or abnormal, and to identify a position of a circuit which is operated at the target frequency. The optical probing techniques are very effective examination techniques because they can be used to identify and analyze a failure location, a failure cause and the like in a semiconductor apparatus.

CITATION LIST

Patent Literature

[Patent Literature 1] Japanese Unexamined Patent Publication No. 2007-64975
[Patent Literature 2] Japanese Unexamined Patent Publication No. 2010-271307

SUMMARY OF INVENTION

Technical Problem

Here, due to miniaturization of the semiconductor apparatus, it is conceivable that a beam spot of the light emitted toward the semiconductor apparatus straddles a plurality of drive elements in the semiconductor apparatus. In this case, interference (a mixture of signals corresponding to the reflected light of each of the plurality of drive elements) occurs in the detection signal. From a waveform based on the detection signal in an interference state (an interference waveform), it may not be possible to examine the semiconductor apparatus with high accuracy.

One aspect of the present invention has been made in view of the above-described circumstances, and relates to a semiconductor apparatus examination method and a semiconductor apparatus examination apparatus capable of improving the accuracy of semiconductor apparatus examination.

Solution to Problem

A semiconductor apparatus examination method according to one aspect of the present invention includes a step of acquiring a first interference waveform based on signals from a plurality of drive elements according to light from a first spot including the plurality of drive elements in a semiconductor apparatus, a step of acquiring a second interference waveform based on signals from the plurality of drive elements according to light from a second spot having a region configured to partially overlap the first spot and including the plurality of drive elements, and a step of separating a waveform signal for each of the drive elements in the first and second spots based on the first and second interference waveforms.

In the semiconductor apparatus examination method according to one aspect of the present invention, the first interference waveform based on the light from the first spot including the plurality of drive elements, and the second interference waveform based on the light from the second spot of which the region partially overlaps the first spot and which includes the plurality of drive elements are acquired, and the waveform signal is separated for each of the drive elements in the first and second spots based on the first and second interference waveforms. It is possible to estimate a degree of influence (a state of involvement of a signal of each of the drive elements in each of the interference waveforms) according to positions of the plurality of drive elements included in the spot related to the interference waveform, for example, by acquiring a time change of the interference waveform of each of the spots of which regions overlap each other. It is possible to appropriately separate the waveform signal of each of the drive elements in the spot from the interference waveform by considering the degree of influence according to the positions of the plurality of drive elements. In this way, when the waveform signal (an original waveform) of each of the drive elements is appropriately separated from the interference waveform, the semiconductor apparatus examination can be performed with high accuracy based on the waveform signal of the drive element after separation.

The above-described semiconductor apparatus examination method may further include a step of arranging and displaying the waveform signal after separation and a reference waveform signal of the semiconductor apparatus or a waveform signal generated by a logic simulation. Thus, at the time of examination of the semiconductor apparatus, a difference from the reference sample (the reference waveform signal of the semiconductor apparatus or the waveform signal generated by the logic simulation) can be displayed to the user in an easy-to-understand manner. Thus, the semiconductor apparatus examination can be performed with higher accuracy.

The above-described semiconductor apparatus examination method may further include a step of comparing the waveform signal after separation with the reference waveform signal of the semiconductor apparatus or the waveform signal generated by the logic simulation. Thus, at the time of examination of the semiconductor apparatus, it is possible to identify the difference from the reference sample (the reference waveform signal of the semiconductor apparatus or the waveform signal generated by the logic simulation). Thus, the semiconductor apparatus examination can be performed with higher accuracy.

The above-described semiconductor apparatus examination method may further include a step of performing alignment between the semiconductor apparatus and a layout image of the semiconductor apparatus based on comparison results between the waveform signal after separation and the waveform signal generated by the logic simulation. Thus, the alignment is performed based on a degree of similarity of the waveform signals, and after the alignment, the semiconductor apparatus examination (identification of a failure position and the like) can be performed with higher accuracy based on the layout image.

The above-described semiconductor apparatus examination method may further include a step of identifying a position of each of the drive elements in the first and second spots based on the waveform signal after separation, and performing the alignment between the semiconductor apparatus and the layout image of the semiconductor apparatus based on the identified position of each of the drive elements. The alignment can be performed more easily as compared with a case of comparing the waveform signals by performing the alignment based on the positions of the drive elements, and after the alignment, the semiconductor apparatus examination (the identification of the failure position and the like) can be performed with higher accuracy based on the layout image.

In the above-described semiconductor apparatus examination method, a separation distance between a center of the first spot and a center of the second spot may be four times or less a separation distance between gates constituting the drive elements. Thus, the waveform according to the light from the first spot and the waveform according to the light from the second spot can be appropriately set to the interference waveforms (the first interference waveform based on signals from the plurality of drive elements and the second interference waveform based on signals from the plurality of drive elements).

The above-described semiconductor apparatus examination method may further include a step of performing noise removal filtering on the first and second interference waveforms. It is possible to appropriately separate the waveform signal based on the interference waveform from which noise is removed by removing the noise using, for example, deep learning, or the like.

The above-described semiconductor apparatus examination method may further include a step of reconstructing a waveform signal at an arbitrary position in the first and second spots based on the first and second interference waveforms. Thus, not only can the waveform signal of the drive element (the waveform signal separated from the interference waveform) be acquired, but the waveform signal at an arbitrary position can also be acquired based on the separated waveform signal.

The above-described semiconductor apparatus examination method may further include a step of irradiating the first and second spots with light, and a step of detecting light from the first spot which is reflected light with respect to the light radiated to the first spot and light from the second spot which is the reflected light with respect to the light radiated to the second spot. Thus, according to the reflected light, the semiconductor apparatus examination can be performed with high accuracy using an optical probing technique such as EOP.

The above-described semiconductor apparatus examination method may further include a step of detecting light from the first spot which is light emitted from the semiconductor apparatus at the first spot, and light from the second spot which is light emitted from the semiconductor apparatus at the second spot. Thus, the semiconductor apparatus examination can be performed with high accuracy, for example, using a technique such as time resolved emission microscopy according to light emission from the semiconductor apparatus.

A semiconductor apparatus examination apparatus according to one aspect of the present invention includes a photodetector configured to detect light from a semiconductor apparatus, and an analysis part, wherein the analysis part is configured to perform acquiring a first interference waveform in light detected by the photodetector based on signals from a plurality of drive elements according to light from a first spot including the plurality of drive elements in the semiconductor apparatus, acquiring a second interference waveform in light detected by the photodetector based on signals from the plurality of drive elements according to light from a second spot of which a region partially overlaps the first spot and which includes the plurality of drive elements, and separating a waveform signal for each of the drive elements in the first and second spots based on the first and second interference waveforms.

The above-described semiconductor apparatus examination apparatus may further include a display part configured to arrange and display the waveform signal after separation and a reference waveform signal of the semiconductor apparatus or a waveform signal generated by a logic simulation.

In the above-described semiconductor apparatus examination apparatus, the analysis part may be configured to further perform comparing the waveform signal after separation with the reference waveform signal of the semiconductor apparatus or the waveform signal generated by the logic simulation.

In the above-described semiconductor apparatus examination apparatus, the analysis part may be configured to further perform alignment between the semiconductor apparatus and a layout image of the semiconductor apparatus based on comparison results between the waveform signal after separation and the waveform signal generated by the logic simulation.

In the above-described semiconductor apparatus examination apparatus, the analysis part may be configured to further perform identifying a position of each of the drive elements in the first and second spots based on the waveform signal after separation, and performing the alignment between the semiconductor apparatus and the layout image of the semiconductor apparatus based on the identified position of each of the drive elements.

In the above-described semiconductor apparatus examination apparatus, a separation distance between a center of the first spot and a center of the second spot may be four times or less a separation distance between gates constituting the drive elements.

In the above-described semiconductor apparatus examination apparatus, the analysis part may be configured to further perform noise removal filtering on the first and second interference waveforms.

In the above-described semiconductor apparatus examination apparatus, the analysis part may be configured to further perform reconstructing a waveform signal at an arbitrary position in the first and second spots based on the first and second interference waveforms.

The above-described semiconductor apparatus examination apparatus may further include a light generation part configured to generate light radiated to the first and second spots, and the photodetector may detect light from the first spot which is reflected light with respect to the light radiated to the first spot and light from the second spot which is the reflected light with respect to the light radiated to the second spot.

In the above-described semiconductor apparatus examination apparatus, the photodetector may detect light from the first spot which is light emitted from the semiconductor apparatus at the first spot, and light from the second spot which is light emitted from the semiconductor apparatus at the second spot.

Advantageous Effects of Invention

According to one aspect of the present invention, it is possible to provide a semiconductor apparatus examination method and a semiconductor apparatus examination apparatus capable of improving accuracy of a semiconductor apparatus examination.

BRIEF DESCRIPTION OF DRAWINGS

FIG. 20 is a diagram showing alignment between a semiconductor apparatus and a layout image.

FIG. 35 is a diagram showing a reconstructed waveform signal.

DESCRIPTION OF EMBODIMENTS

Figure 1:
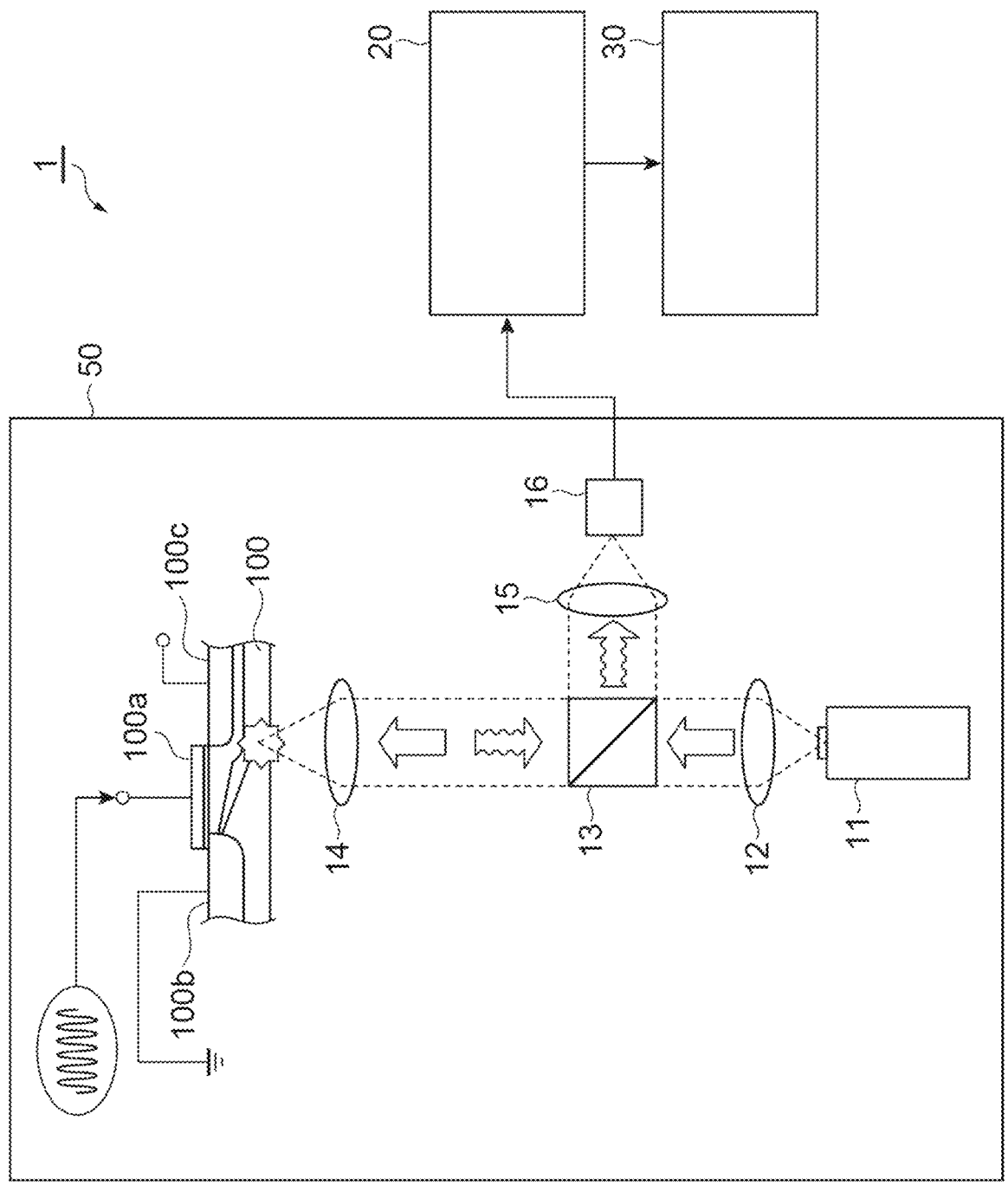
FIG. 1 is a configuration diagram of a semiconductor apparatus examination apparatus according to a first embodiment of the present invention.

Hereinafter, embodiments of the present invention will be described in detail with reference to the drawings. In each of the drawings, the same or corresponding parts are designated by the same reference numerals, and duplicate description will be omitted.

First Embodiment

FIG. 1 is a configuration diagram of a semiconductor apparatus examination apparatus 1 according to a first embodiment. The semiconductor apparatus examination apparatus 1 is an apparatus for examining (measuring) a semiconductor apparatus 100, such as identifying an abnormality occurrence location in the semiconductor apparatus 100 which is an apparatus under test (DUT).

The semiconductor apparatus 100 may be an integrated circuit (IC) having a PN junction such as a transistor, a logic apparatus which is a large scale integration (LSI) circuit, a memory apparatus, an analog apparatus, or a mixed signal apparatus that is a combination thereof, or may be a power semiconductor apparatus (a power apparatus) such as a high-current/high-voltage MOS transistor, a bipolar transistor, or an IGBT.

The semiconductor apparatus examination apparatus 1 examines the semiconductor apparatus 100 using an optical probing technique. In the present embodiment, the semiconductor apparatus examination apparatus 1 will be described as an apparatus which examines the semiconductor apparatus 100 using the optical probing technique called electro optical probing (EOP). The semiconductor apparatus examination apparatus 1 may be an apparatus which examines the semiconductor apparatus 100 by another optical probing technique. When the semiconductor apparatus 100 is examined by EOP, a drain potential of the semiconductor apparatus 100 changes as a voltage pattern (an operation pulse signal) is swept to a gate 100a of the semiconductor apparatus 100 by a tester (not shown), a carrier density of the semiconductor apparatus 100 changes, and a refractive index and a light absorption rate of the semiconductor apparatus 100 change. In this state, when the semiconductor apparatus 100 is irradiated with light emitted from a light source 11, an intensity and phase of reflected light change according to changes in the refractive index and the light absorption rate. Such reflected light is detected by a photodetector 16, and a detection signal is acquired. Then, a waveform (an EOP waveform) can be obtained by displaying amplitude energy of the acquired detection signal with a lapse of time. The semiconductor apparatus examination apparatus 1 identifies an abnormality occurrence location in the semiconductor apparatus 100 based on, for example, the EOP waveform.

When the EOP waveform is obtained, the semiconductor apparatus examination apparatus 1 separates the waveform signal for each drive element of the semiconductor apparatus 100. Hereinafter, the separation of the waveform signal performed by the semiconductor apparatus examination apparatus 1 will be described with reference to FIGS. 2 to 8.

Figure 2:
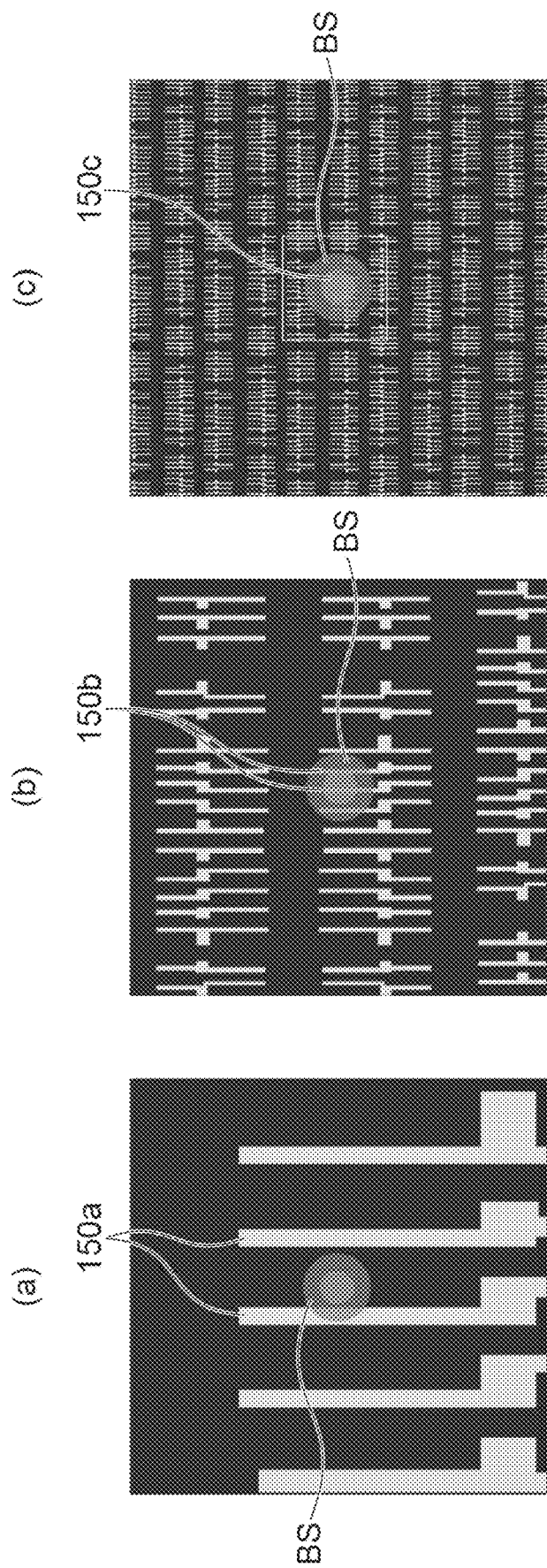
FIG. 2 is a diagram showing an example of a relationship between an apparatus pattern and a light beam spot.

FIG. 2 is a diagram showing an example of a relationship between an apparatus pattern and a light beam spot. FIG. 2(a) shows the relationship between an apparatus pattern of a semiconductor apparatus using a 180 nm process and a light beam spot BS, FIG. 2(b) shows the relationship between the apparatus pattern of the semiconductor apparatus using a 45 nm process and the light beam spot BS, and FIG. 2(c) shows the relationship between the apparatus pattern of the semiconductor apparatus using a 10 nm process and the light beam spot BS. Here, when light having a wavelength of 1300 nm is concentrated by a special lens called a solid immersion lens (SIL) which improves image resolution, assuming that physical quantity called a numerical aperture (NA) which determines performance of the solid immersion lens is 3.1, 256 nm is theoretically calculated as the image resolution according to Rayleigh's calculation formula. A spot of light at that time has a diameter of 214 nm corresponding to FWHM, and a size thereof corresponding to a diameter of the entire spot called an Airy disk is 512 nm. In FIG. 2, a dark portion in a central portion of the light beam spot BS is described as the FWHM having the diameter of 214 nm, and a peripheral light portion thereof is described as the Airy disk having the diameter of 512 nm. In the semiconductor apparatus using the 180 nm process shown in FIG. 2(a), since a pitch of a contact gate is designed to be relatively large, the light beam spot BS overlaps only one drive element 150a (that is, only one drive element 150a can be irradiated with light). In this case, a detection signal corresponding to reflected light of one drive element is acquired. On the other hand, in the semiconductor apparatus using the 45 nm process shown in FIG. 2(b), since the pitch of the contact gate is smaller than that of the semiconductor apparatus using the 180 nm process, the light beam spot BS straddles a plurality of drive elements 150b (that is, the plurality of drive elements 150b are irradiated with light). In this case, interference (a mixture of signals corresponding to the reflected light of each of the plurality of drive elements 150b) occurs in the detection signal. Similarly, also in the miniaturized semiconductor apparatus using the 10 nm process shown in FIG. 2(c), the light beam spot BS straddles the plurality of drive elements 150c, and interference occurs in the detection signal. As described above, when a semiconductor apparatus that has been miniaturized in recent years is examined by the optical probing technology, interference in the detection signal becomes a problem.

Figure 3:
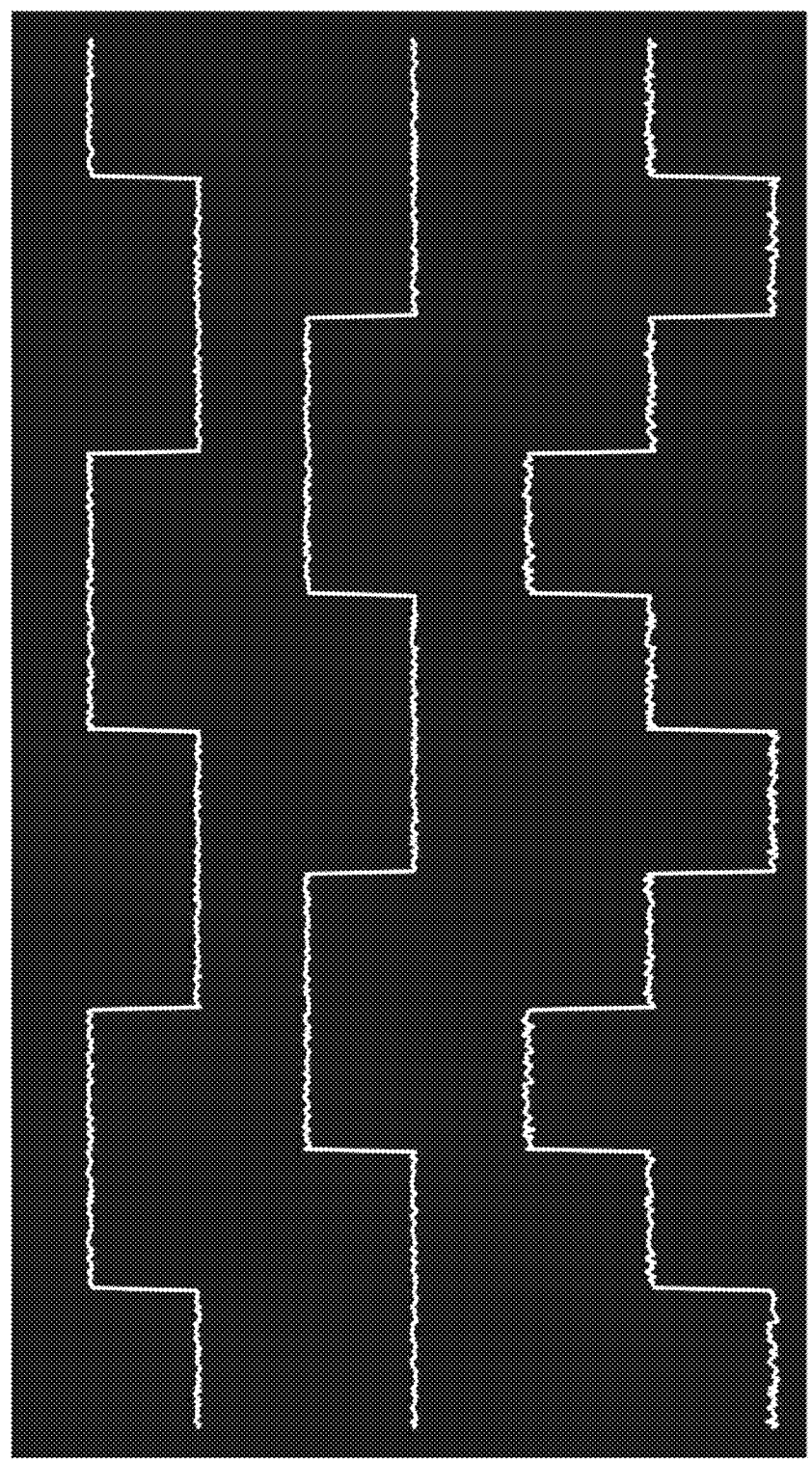
FIG. 3 is a diagram showing an interference waveform.

FIG. 3 is a diagram showing an interference waveform. An EOP waveform (an interference waveform) based on the detection signal in an interference state is formed by waveform signals of the plurality of drive signals overlapping each other. For example, in the example shown in FIG. 3, a phase difference between a waveform signal of a drive element A and a waveform signal of a drive element B is about π/4. In the interference waveform in which two waveform signals overlaps each other, a wave height thereof has two stages.

Figure 4:
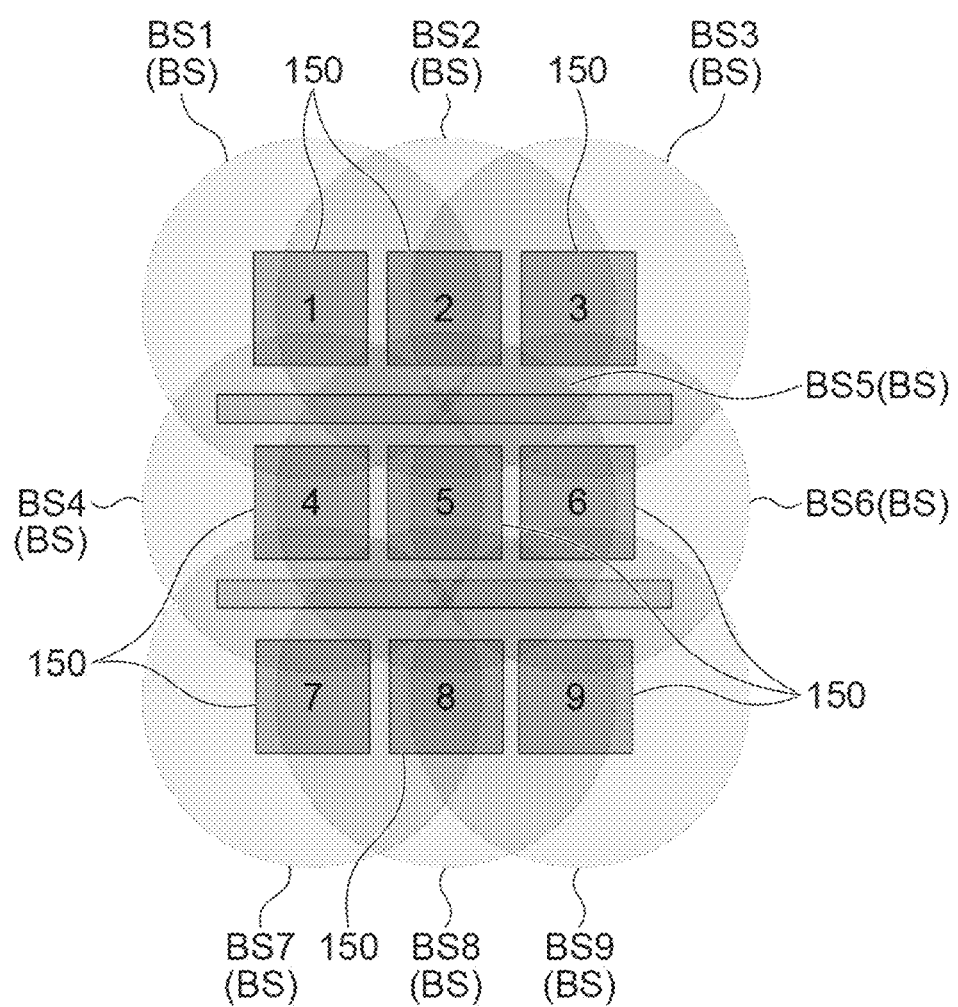
FIG. 4 is a diagram showing a setting example of a light beam spot.

The semiconductor apparatus examination apparatus 1 enhances the examination accuracy of the semiconductor apparatus 100 by separating the waveform signal of each of the drive elements from the interference waveform as described above. FIG. 4 is a diagram showing a setting example of the light beam spot BS. In the example shown in FIG. 4, a plurality of drive elements 150 ("elements 1 to 9" shown in FIG. 4) are disposed in a grid pattern. Then, in the semiconductor apparatus examination apparatus 1, a plurality of light beam spots BS are set in a grid shape so that parts of regions thereof overlap each other. For example, in the example shown in FIG. 4, the light beam spot BS1 is set so that a part of the region thereof overlaps those of the light beam spots BS2, BS3, BS4, BS5, and BS6, and the light beam spot BS2 is set so that a part of the region thereof overlaps those of the light beam spots BS1, BS3, BS4, BS5, and BS6. In the present embodiment, for example, a semiconductor apparatus using a 45 nm process (or a semiconductor apparatus smaller than that) is used as the semiconductor apparatus 100, and each of the light beam spots BS straddles the plurality of drive elements 150. For example, in the example shown in FIG. 4, the light beam spot BS1 straddles the drive elements 150 represented by "element 1", "element 2", "element 4", and "element 5", and the light beam spot BS2 straddles the drive elements 150 represented by "element 1", "element 2", "element 3", "element 4", "element 5", and "element 6". Therefore, the signals from the plurality of drive elements 150 are mixed with the signals acquired according to the light (the reflected light) from each of the light beam spots. That is, the semiconductor apparatus examination apparatus 1 can acquire the interference waveform according to the light from each of the light beam spots. At the time of setting the light beam spots BS, it is not known which drive element 150 overlaps each of the light beam spots BS.

Figure 5:
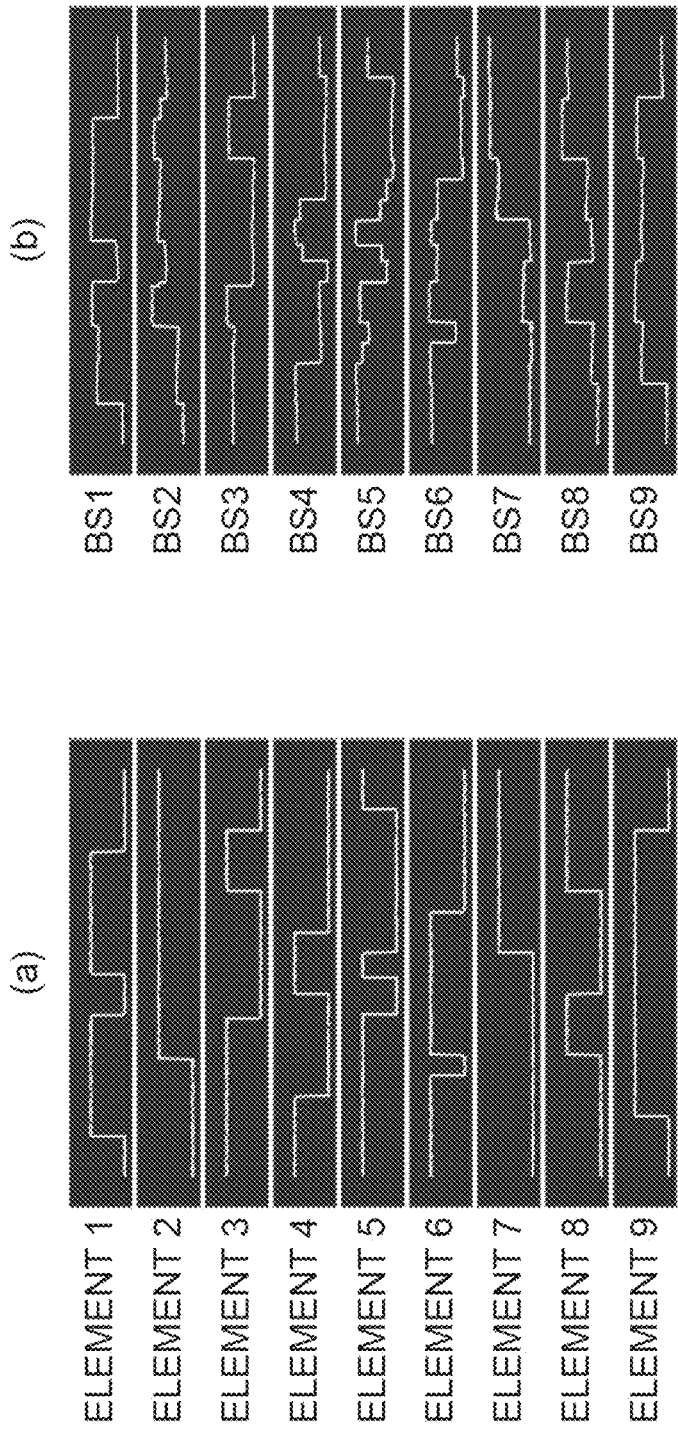
FIG. 5 is a diagram showing an interference waveform at each light beam spot.

FIG. 5 is a diagram showing the interference waveform in each of the light beam spots BS. FIG. 5(a) is a diagram showing the waveform signal in each of the drive elements 150 ("element 1" to "element 9"). FIG. 5(b) is a diagram showing the interference waveforms in each of the light beam spots BS (BS1 to BS9). As described above, since the signals acquired in each of the light beam spots BS are mixed with the signals from the plurality of drive elements 150, as shown in FIG. 5(b), the waveform acquired in each of the light beam spots BS is an interference waveform. In the case in which an abnormality occurrence location in the semiconductor apparatus 100 is identified, it is important to acquire the waveform signal for each of the drive elements 150 ("element 1" to "element 9") as shown in FIG. 5(a). Therefore, in the semiconductor apparatus examination apparatus 1 of the present embodiment, the waveform signals of each of the drive elements 150 ("element 1" to "element 9") as shown in FIG. 5(a) are acquired (separated) from the interference waveform acquired in each of the light beam spots BS as shown in FIG. 5(b). A method of separating the waveform signal will be described later.

Figure 6:
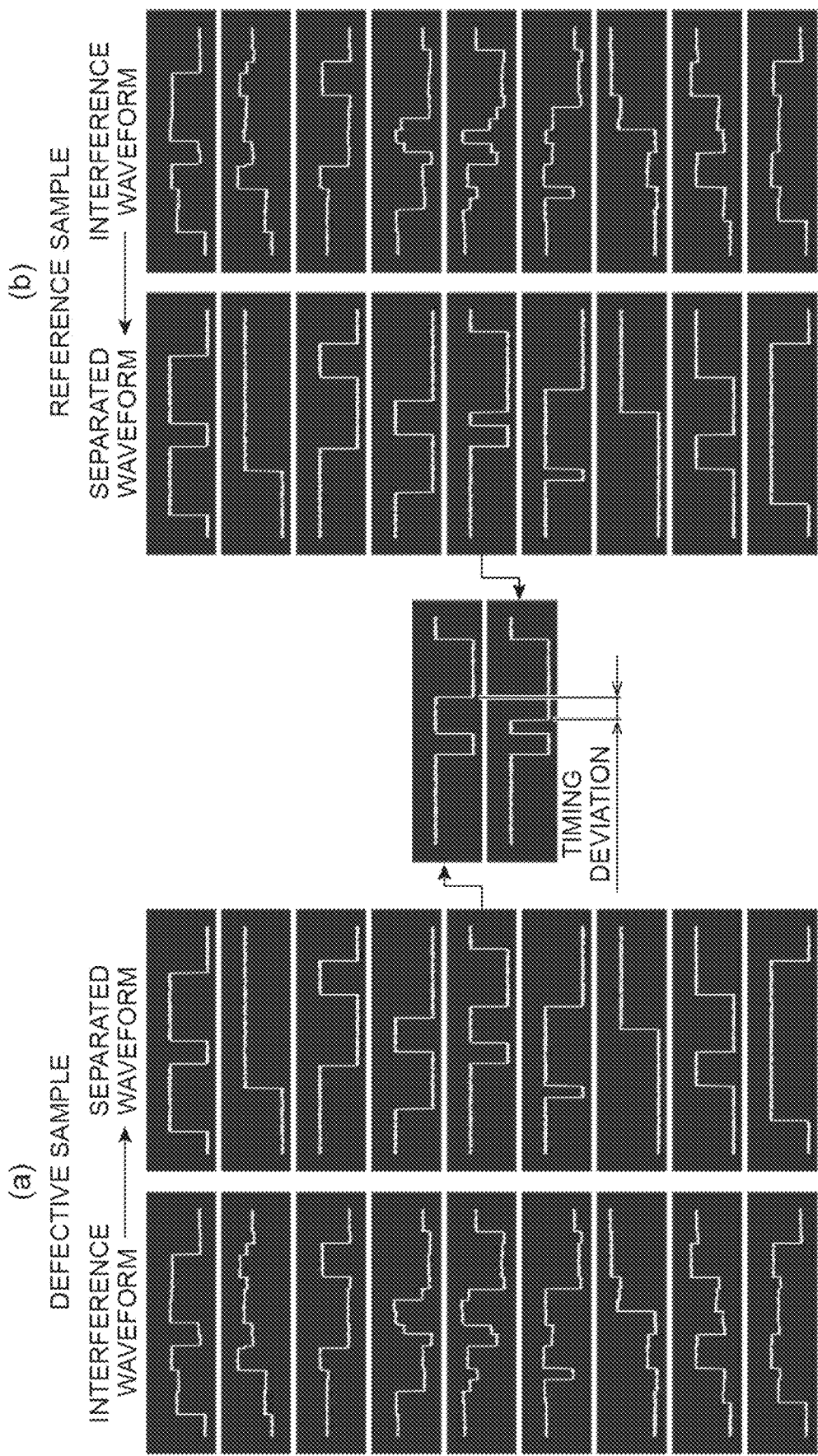
FIG. 6 is a diagram showing an outline of a method of identifying an abnormality occurrence location.

Then, the semiconductor apparatus examination apparatus 1 identifies the abnormality occurrence location based on the separated waveform (the waveform signal for each of the drive elements) obtained by being separated from the interference waveform. FIG. 6 is a diagram showing an outline of a method of identifying an abnormality occurrence location. In FIG. 6(a), it is shown that a separated waveform is acquired from a plurality of interference waveforms of a semiconductor apparatus (a defective sample) suspected of having an abnormality. Further, in FIG. 6(b), it is shown that a separated waveform is acquired from a plurality of interference waveforms of a semiconductor apparatus (a reference sample) in which no abnormality has occurred. The semiconductor apparatus examination apparatus 1 compares the separated waveform of the defective sample with the separated waveform of the reference sample, and identifies a location at which the waveforms are similar to each other, but timing deviation or the like occurs and a degree of coincidence is low. The semiconductor apparatus examination apparatus 1 identifies the abnormality occurrence location in the defective sample based on a location at which such timing deviation or the like occurs.

Figure 7:
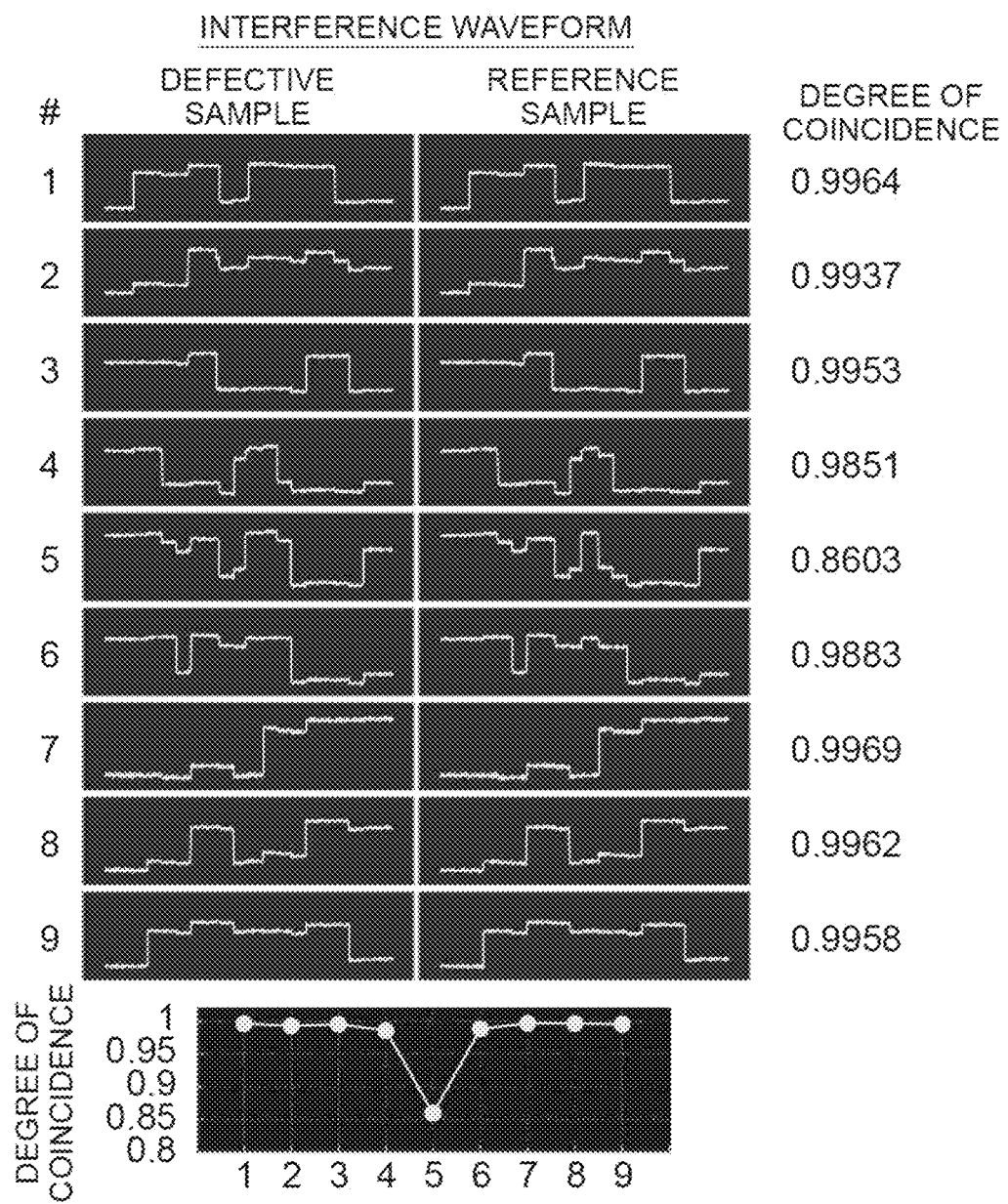
FIG. 7 is a diagram showing a degree of coincidence of each waveform when interference waveforms of a defective sample and a reference sample are compared.
Figure 8:
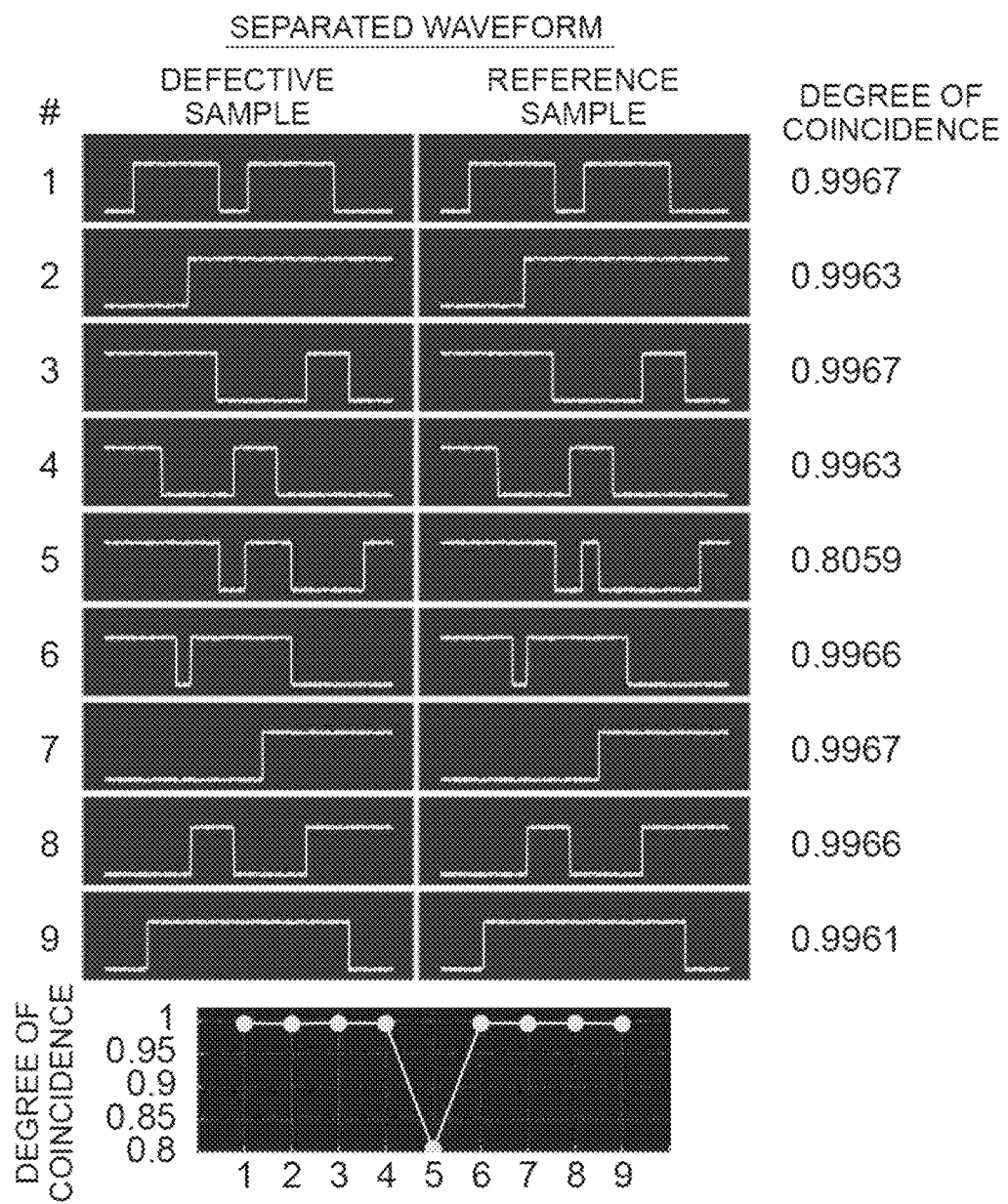
FIG. 8 is a diagram showing the degree of coincidence of each waveform when separated waveforms of the defective sample and the reference sample are compared.

The superiority of identifying the abnormality occurrence location by comparing the separated waveforms of the defective sample and the reference sample (significance in terms of accuracy compared to a case in which the interference waveforms are compared) will be described with reference to FIGS. 7 and 8. FIG. 7 is a diagram showing the degree of coincidence of each of the waveforms when the interference waveforms of the defective sample and the reference sample are compared. As shown in FIG. 7, in the fifth waveform from the top, the degree of coincidence between the waveform of the defective sample and the waveform of the reference sample is 0.8603. FIG. 8 is a diagram showing the degree of coincidence of each of the waveforms when the separated waveforms of the defective sample and the reference sample are compared. As shown in FIG. 8, in the fifth waveform from the top, the degree of coincidence between the waveform of the defective sample and the waveform of the reference sample is 0.8059. As described above, when the abnormality occurrence location is identified, the location at which the degree of coincidence between the waveform of the defective sample and the waveform of the reference sample is low is identified, and thus, when the separated waveforms are compared with each other, it is possible to derive a low degree of coincidence between the waveform of the defective sample and the waveform of the reference sample at the abnormality occurrence location. From this, it can be said that the abnormality occurrence location can be identified more reliably with high accuracy by comparing the separated waveforms. The degree of coincidence is derived, for example, by calculating Pearson's correlation coefficient.

Returning to FIG. 1, a configuration of the semiconductor apparatus examination apparatus 1 will be described. The semiconductor apparatus examination apparatus 1 includes a light source 11 (a light generation part), a light guide lens 12, a light branching optical system 13, an objective lens 14, a condenser lens 15, a photodetector 16, a control apparatus 20 (an analysis part), a monitor 30 (a display part), and a dark box 50. The dark box 50 accommodates configurations other than the control apparatus 20 and the monitor 30 among the configurations described above, and is provided to prevent an influence of external light on each of the accommodated configurations.

The light source 11 generates light to be radiated to the light beam spot of the semiconductor apparatus examination apparatus 1 and outputs the light. The light source 11 is configured of, for example, a super luminescent diode (SLD). The light source 11 may be a laser light source such as a laser diode (LD), or an incoherent light source using a light emitting diode (LED), a lamp light source, or the like. The light guide lens 12 is, for example, a single or composite convex lens, and guides the light output from the light source 11 to the light branching optical system 13.

Here, the relationship between an interval between the light beam spots adjacent to each other and an interval between the gates constituting the drive elements adjacent to each other will be described. In a method of separating a waveform signal according to the present embodiment, it is necessary for each of the light beam spots to be in an interference state with the same drive element included in the adjacent light beam spots. Therefore, an interval (a grid pitch) between the light beam spots and an interval (a gate pitch) between the gates are set within a certain range to achieve the above-described interference state. For example, when the grid pitch is set independently of the gate pitch, an interference ratio changes for each of the light beam spots. In order to make the interference ratio for each of the light beam spots constant, the grid pitch may be set to, for example, an integral multiple of the gate pitch. In addition, when the grid pitch is set to be excessively large with respect to the gate pitch, the light beam spots which are not mixed with each other (information cannot be properly input) will occur. For example, when beam conditions are such that a wavelength $\lambda=1300$ nm, an aperture ratio NA of the objective lens 14 is 3.1, and a full width at half maximum (FWHM)=214 nm, and apparatus conditions of the semiconductor apparatus 100 are such that a gate length $l=28$ nm and a gate pitch is about four times the gate length l, if the grid pitch is set to be larger than four times the gate pitch, the interference may not occur properly. That is, a separation distance between a center of a first light beam spot and a center of a second light beam spot adjacent to the first light beam spot may be four times or less the separation distance between the gates constituting the drive elements.

The light branching optical system 13 transmits the light output from the light source 11 and arriving through the light guide lens 12 in a direction of the semiconductor apparatus 100. The light branching optical system 13 may further include a light scanning optical system which scans the semiconductor apparatus 100 with irradiation light. The objective lens 14 concentrates the light (the irradiation light) guided by the light branching optical system 13 on the semiconductor apparatus 100. The light beam spot which is a light concentration point on the semiconductor apparatus 100 is switched, for example, by moving a chuck (not shown) holding the semiconductor apparatus 100 in an XY direction (a forward-rearward/left-right direction), that is, in a direction along a mounting surface of the semiconductor apparatus 100 in the chuck. Such a chuck is moved in the XY direction (the forward-rearward/left-right direction) by, for example, an XY stage (not shown). The XY stage moves the chuck in the XY direction so that a plurality of preset light beam spots are sequentially set as irradiation regions of the irradiation light according to control of the control apparatus 20.

Further, the light branching optical system 13 guides the reflected light reflected by the semiconductor apparatus 100 with respect to the light radiated on the semiconductor apparatus 100 in a direction of the photodetector 16. The condenser lens 15 concentrates the reflected light on the photodetector 16.

The photodetector 16 detects the reflected light which has arrived through the light branching optical system 13 and the condenser lens 15, and outputs a detection signal corresponding to the reflected light. The photodetector 16 is an avalanche photo diode (APD), a photo diode (PD), a photo multiplier tube (PMT), or the like.

The control apparatus 20 controls the XY stage (not shown), the light source 11, and the photodetector 16. Specifically, the control apparatus 20 controls switching of the irradiation region (the light beam spot) of the irradiation light by controlling the XY stage. The control apparatus 20 performs emission adjustment of the irradiation and adjustment of a wavelength and an amplitude of the irradiation light by controlling the light source 11. The control apparatus 20 controls the photodetector 16 to perform adjustments related to the detection of the reflected light. Further, the control apparatus 20 acquires each of the interference waveforms according to the reflected light acquired at each of the light beam spots, and separates the waveform signal for each of the drive elements in each of the light beam spots based on each of the interference waveforms. A function of the control apparatus 20 related to the separation of the waveform signal will be described later.

The control apparatus 20 is a computer, and is physically configured to include a memory such as a RAM and a ROM, a processor (an operation circuit) such as a CPU, a communication interface, and a storage part such as a hard disk. Examples of the control apparatus 20 include a personal computer, a cloud server, a smart apparatus (a smartphone, a tablet terminal, and the like) and the like. The control apparatus 20 functions by executing a program stored in the memory with a CPU of a computer system. Further, the control apparatus 20 may be configured of a microcomputer or an FPGA.

Next, the function of the control apparatus 20 related to the separation of the waveform signal will be described in detail.

The control apparatus 20 is configured to perform acquiring a first interference waveform in the reflected light detected by the photodetector 16 based on the signals from the plurality of drive elements according to light from the first light beam spot including the plurality of drive elements in the semiconductor apparatus 100, acquiring a second interference waveform in the reflected light detected by the photodetector 16 based on signals from the plurality of drive elements according to light from the second light beam spot of which a region partially overlaps the first light beam spot and which includes the plurality of drive elements, and separating the waveform signal for each of the drive elements in the first and second light beam spots based on the first and second interference waveforms. The first and second light beam spots indicate that there are a plurality of (at least two or more) light beam spots of which regions partially overlap each other. Further, the first and second interference waveforms indicate that a plurality of (at least two or more) interference waveforms are used when the waveform signal for each of the drive elements is separated. In the following, a center of each of the light beam spots (a point at which the interference waveform is acquired) may be described as a grid point.

An example of a specific waveform signal separation process will be described. Here, a method of estimating a position and a waveform signal (each of the waveform signals separated from the interference waveform) of each of the drive elements to acquire the time change of each of the interference waveforms and to realize the wave height of each of the interference waveforms at each time will be described.

Figure 9:
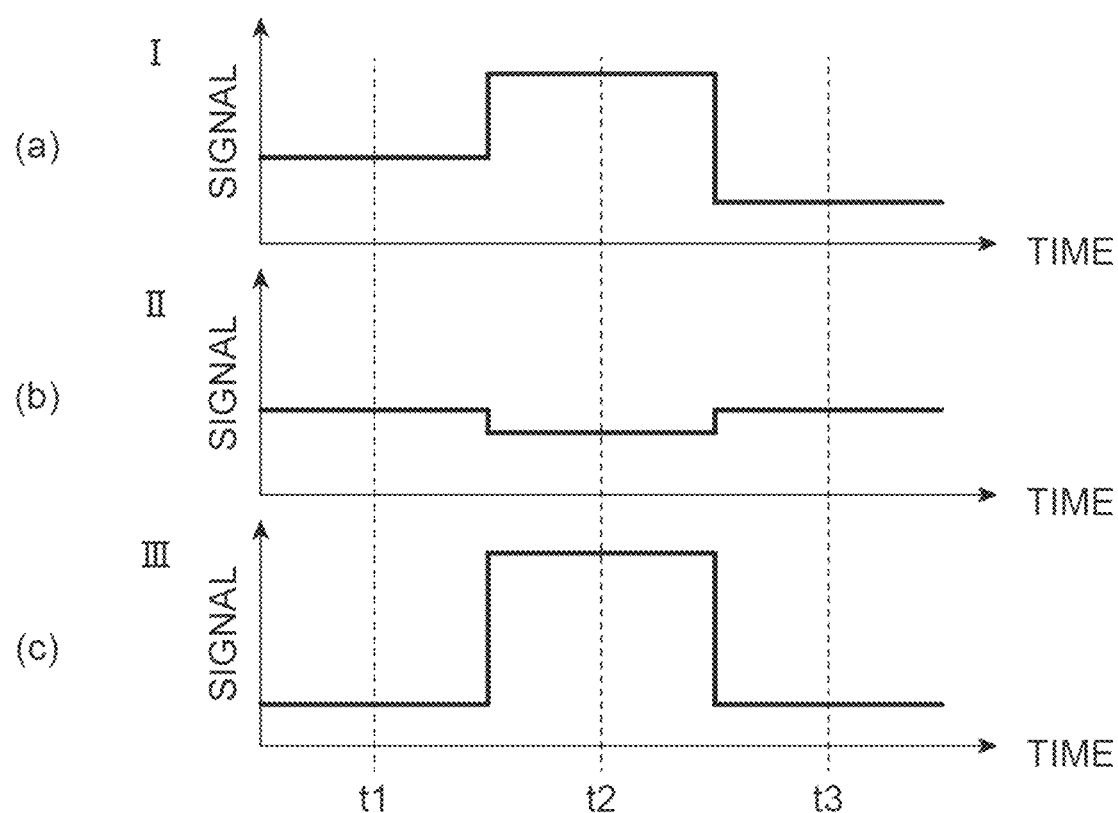
FIG. 9 shows a time change of the interference waveform acquired with respect to a grid point of each of three light beam spots of which regions partially overlap each other.
Figure 10:
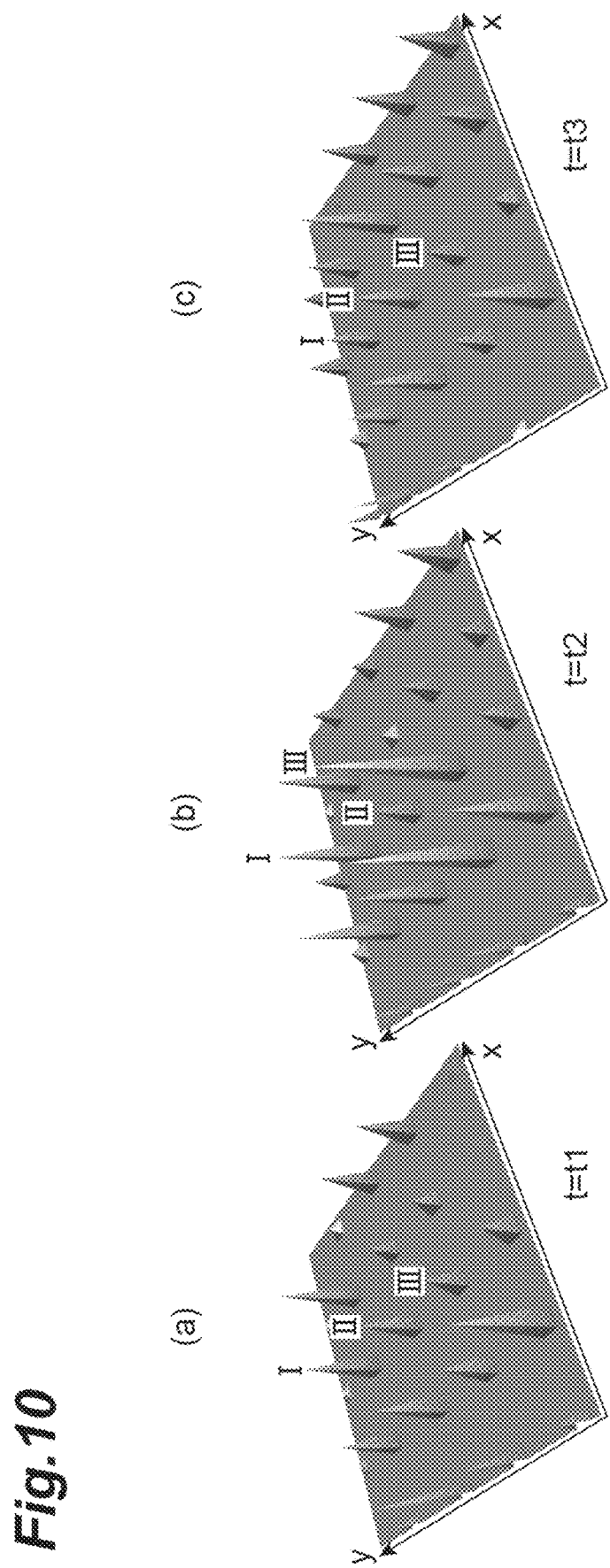
FIG. 10 is a diagram showing a time change of a wave height of each grid point including the grid points shown in FIG. 9.

FIG. 9 shows the time change of the interference waveform acquired for grid points I to III of each of three light beam spots of which regions partially overlap each other. FIG. 9(a) shows the time change (including time: t1 to t3) of the interference waveform with respect to the grid point I. FIG. 9(b) shows the time change (including time: t1 to t3) of the interference waveform with respect to the grid point II. FIG. 9(c) shows the time change (including time: t1 to t3) of the interference waveform with respect to the grid point III. FIG. 10 is a diagram representing the time change of the wave height of each of grid points including the grid points I to III shown in FIG. 9. FIG. 10(a) shows the wave height of each of the grid points at time: t1. FIG. 10(b) shows the wave height of each of the grid points at time: t2. FIG. 10(c) shows the wave height of each of the grid points at time: t3. In this method, the waveform before interference (that is, the waveform signal of each of the drive elements) is obtained by reproducing the wave height for each of the grid points.

Figure 11:
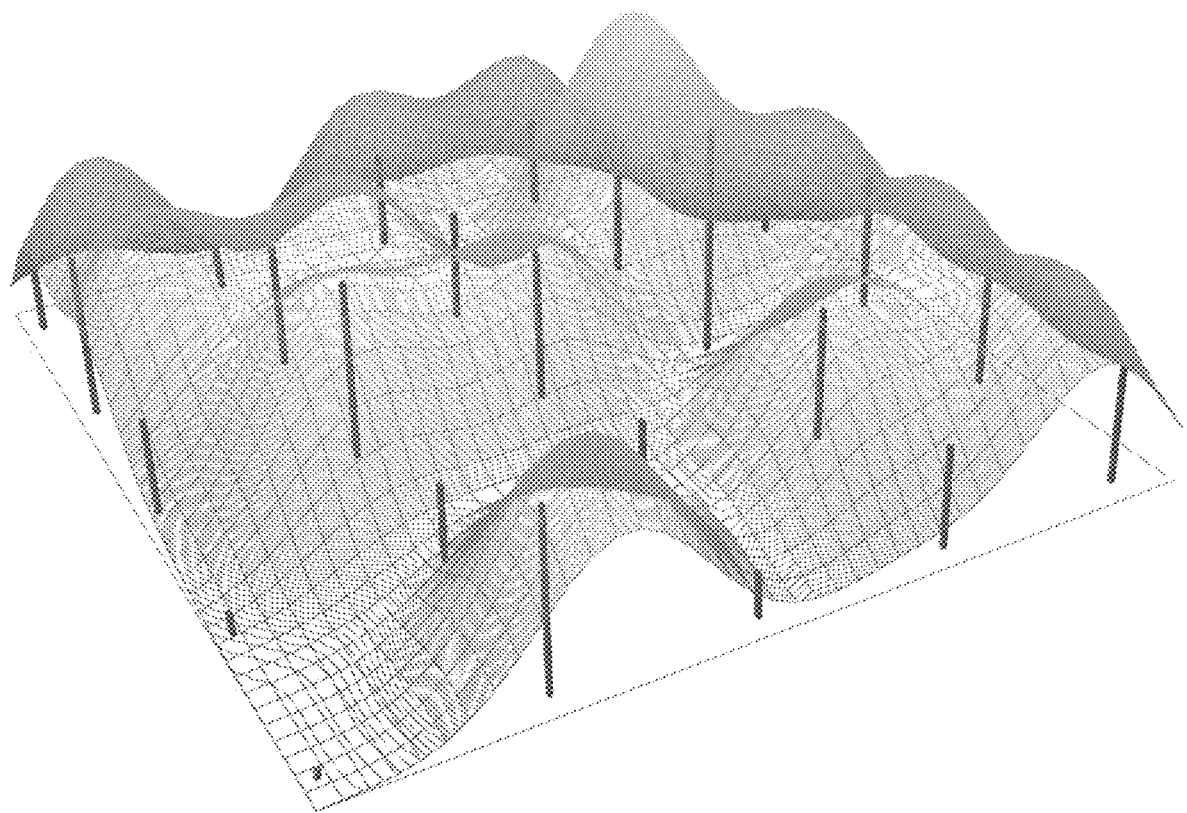
FIG. 11 is a diagram showing a signal distribution which reproduces the wave height of each grid point at a time t3 shown in FIG. 10(c).

FIG. 11 is a diagram showing a signal distribution which reproduces the wave height of each of the grid points at the time: t3 shown in FIG. 10(c). The control apparatus 20 sets a plurality of analysis points within a grid setting range, for example. The analysis points may be, for example, each pixel when an inside of the grid is displayed as an image. Then, the control apparatus 20 repeats a calculation, for example, assuming a Gaussian distribution corresponding to a beam diameter at each of the analysis points as appropriate, and obtains a combination (a combination of the waveform signals of each of the analysis points) which reproduces the wave height of each of the grid points at a specific time (a length of a vertical bar line shown in FIG. 11). Thus, a point (a position) corresponding to the drive element and the waveform signal can be estimated from each of the analysis points. Instead of assuming the Gaussian distribution described above, a Bessel function closer to a beam convergence distribution may be used. A change in the interference waveform on a grid setting plane can be obtained by setting the Gaussian distribution (or the Bessel function) at an appropriate position and adding a contribution of each position.

Figure 12:
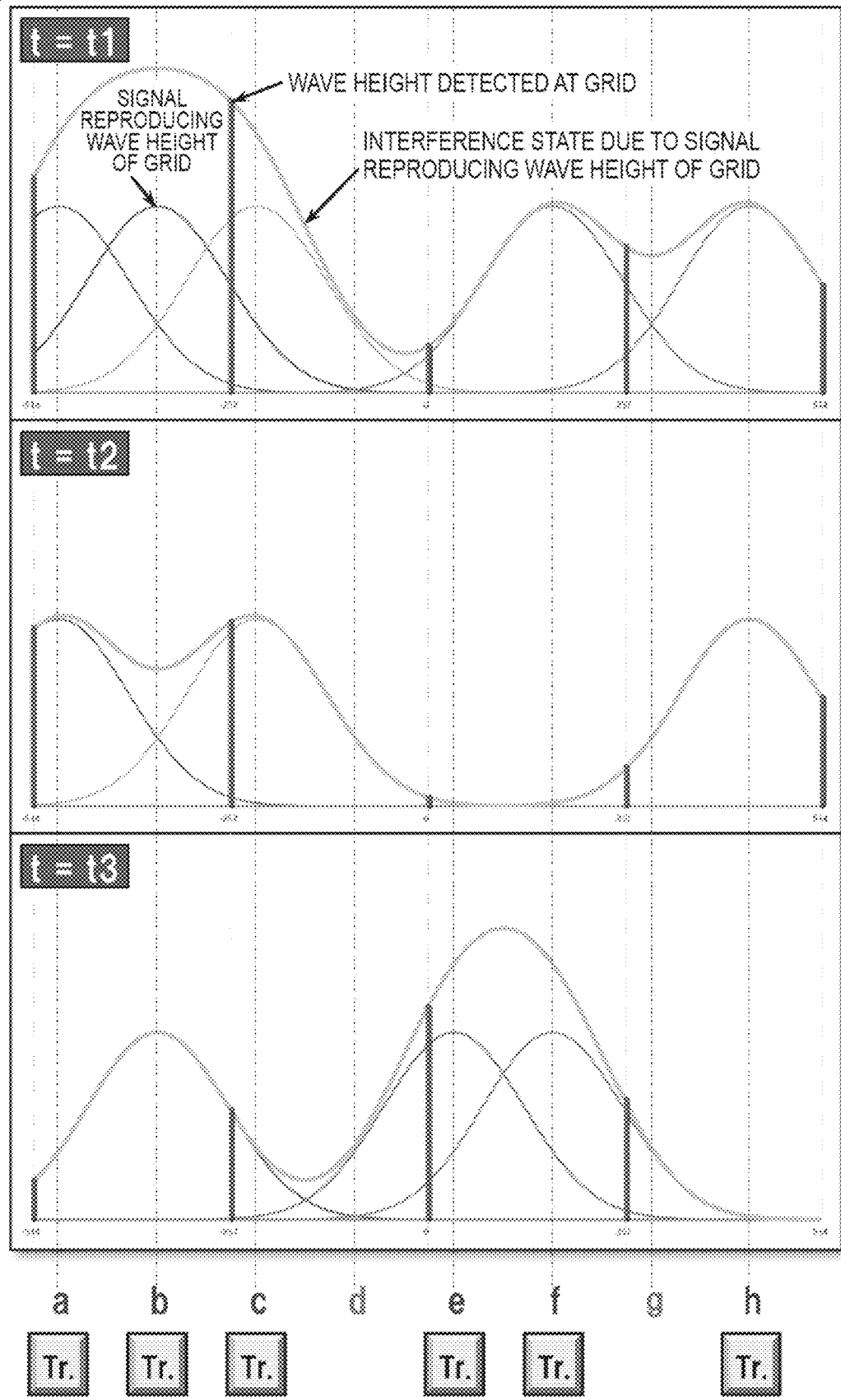
FIG. 12 is a diagram showing a process of estimating a position of a drive element from the time change of the interference waveform.

FIG. 12 is a diagram showing a process of estimating the position of the drive element from the time change of the interference waveform. In FIG. 12, the wave height at each of the grid points at time: t1, the wave height at each of the grid points at time: t2, and the wave height at each of the grid points at time: t3 are shown in order from the top. In FIG. 12, a horizontal axis indicates the position, the vertical axis indicates the wave height, and the vertical bar lines indicate the wave heights detected at the grid points. The control apparatus 20 obtains a combination of signals which reproduces the wave height at the grid point at each time. That is, the control apparatus 20 derives a curve (refer to FIG. 12) indicating the interference state by calculating a position of the Gaussian distribution representing an involvement status of the signal from a grid inner region point (an analysis point) in a grid range so that the wave height at the grid point is reproduced and reproducing the wave height at the grid point with each signal. The grid inner region point which reproduces the interference state is initially set at random as appropriate and is repeatedly calculated so that the wave height at the grid point is reproduced, and coordinates (a position) thereof are obtained by a convergence of the calculation. The grid interior point converges to a plurality of fixed coordinates by performing such a calculation at different times.

In the example shown in FIG. 12, for example, the grid inner region points have the coordinates: a, b, c, e, f, and h, and can reproduce the wave heights at the grid points at each time only by the contribution of the signals from the coordinates: a, b, c, e, f, and h. This means that a generation source (that is, the drive element) of a signal indicating high and low changes is present at the coordinates: a, b, c, e, f, and h. On the other hand, the coordinates: d and g shown in FIG. 12 are not used for reproducing a change in the wave height at any time, and it can be said that the drive element is not present at the coordinates: d and g. The position of the drive element as described above can be derived with higher accuracy by performing calculations with respect to many times. After part of the coordinates of the drive element is obtained, assuming that the generation source of the signal is present at the coordinates, the Gaussian distribution can be on/off at the coordinates to reproduce the wave height, and a calculation time for obtaining the coordinates of other drive elements can be shortened.

Figure 13:
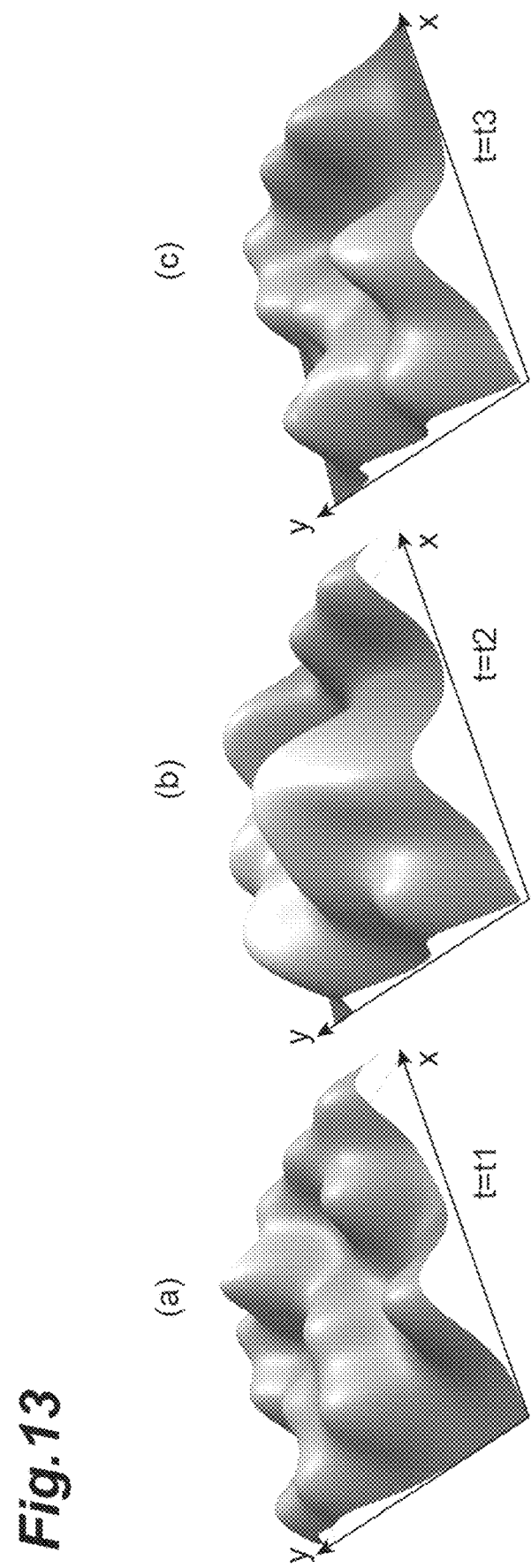
FIG. 13 is a diagram showing a wave height curved surface of the interference waveform reproduced at each time.
Figure 14:
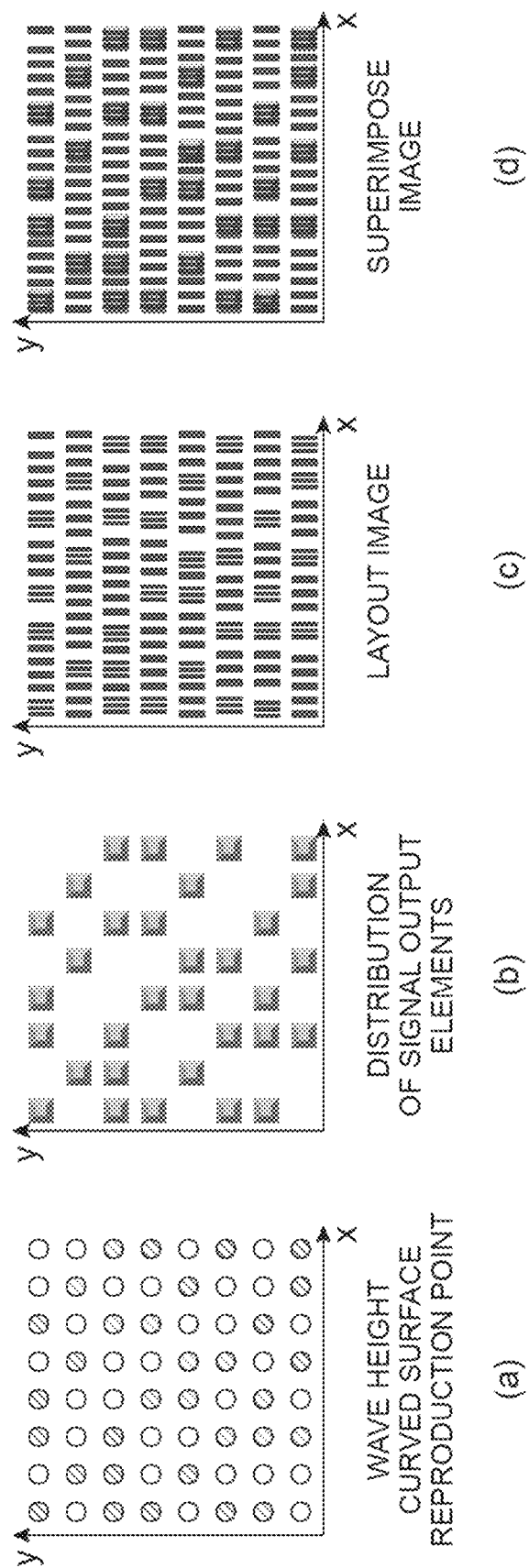
FIG. 14 is a diagram showing a position distribution of the drive elements.

FIG. 13 is a diagram showing a wave height curved surface of the interference waveform reproduced at each time. FIG. 13(a) shows the wave height curved surface of the interference waveform at time: t1, FIG. 13(b) shows the wave height curved surface of the interference waveform at time: t2, and FIG. 13(c) shows the wave height curved surface of the interference waveform at time: t3. FIG. 14 is a diagram showing a position distribution of the drive elements. When the wave height curved surface of the interference waveform changes with time as shown in FIGS. 13(a) to 13(c), it is assumed that set coordinates (wave height curved surface reproduction points) of the Gaussian distribution forming the wave height curved surface are positions shown by hatching in FIG. 14(a). Since such wave height curved surface reproduction points can be rephrased as the positions of the drive elements, the distribution of the drive elements (signal output elements) is shown as in FIG. 14(b). On the other hand, a drive element (a transistor) capable of outputting a signal can be identified from a layout image of the semiconductor apparatus 100. In the layout image shown in FIG. 14(c), the drive element (the transistor) is schematically shown by three narrow rectangles, and a pattern which does not generate a signal is shown by a wide rectangle. Then, it is possible to generate a superimpose image shown in FIG. 14(d) by comparing and contrasting the distribution of the drive elements shown in FIG. 14(b) with the layout image shown in FIG. 14(c). It is possible to recognize from which position on the layout image the signal is detected using the superimpose image of FIG. 14(d).

Figure 15:
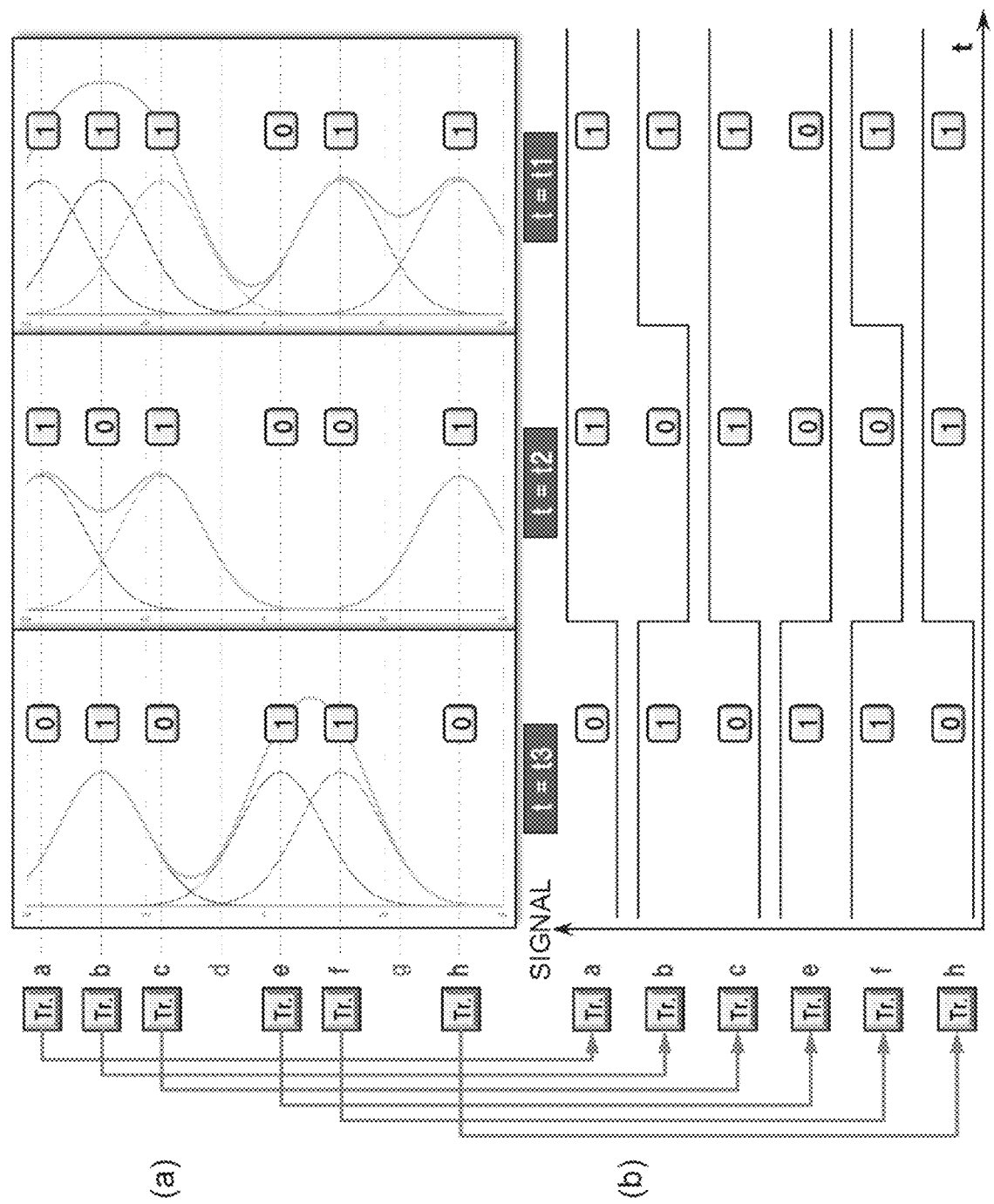
FIG. 15 is a diagram showing a process of separating a waveform signal for each drive element.

After the coordinates of the drive elements are obtained as described above, the waveform signal can be separated for each of the drive elements involved in the interference waveform by recognizing the time change of the signal of each of the drive elements. FIG. 15 is a diagram showing a process of separating a waveform signal for each of the drive elements. FIG. 15(a) is a diagram showing an interference waveform at each time and a signal (a signal of each of the drive elements) for reproducing the interference waveform. FIG. 15(b) is a diagram showing a signal level time change of each of the drive elements. As shown in FIG. 15(a), a case in which the interference waveform is reproduced according to the presence or absence of a Gaussian distribution shape signal at the coordinates: a, b, c, e, f, and h in which it is assumed that the drive element is present is considered. In FIG. 15(a), the presence of a signal corresponds to an output of the high (a square indicated by the number "1" in the drawing), and the absence of the signal corresponds to an output of the low (a square indicated by the number "0" in the drawing). FIG. 15(b) shows a high-low level (a signal level) of each of the drive elements for each time. Such a waveform showing the signal level time change of each of the drive elements (for each of the coordinates) corresponds to a waveform signal of each of the drive elements separated from the interference waveform.

Another example of a specific process of separating a waveform signal will be described. Here, a method of estimating the waveform signal of each of the drive elements (each of the waveform signals separated from the interference waveform) by randomly setting the position of the drive element and repeating the process of comparing the wave height of the signal obtained by adding up influences of the set drive elements with the wave height acquired at each of the grid points will be described.

Figure 16:
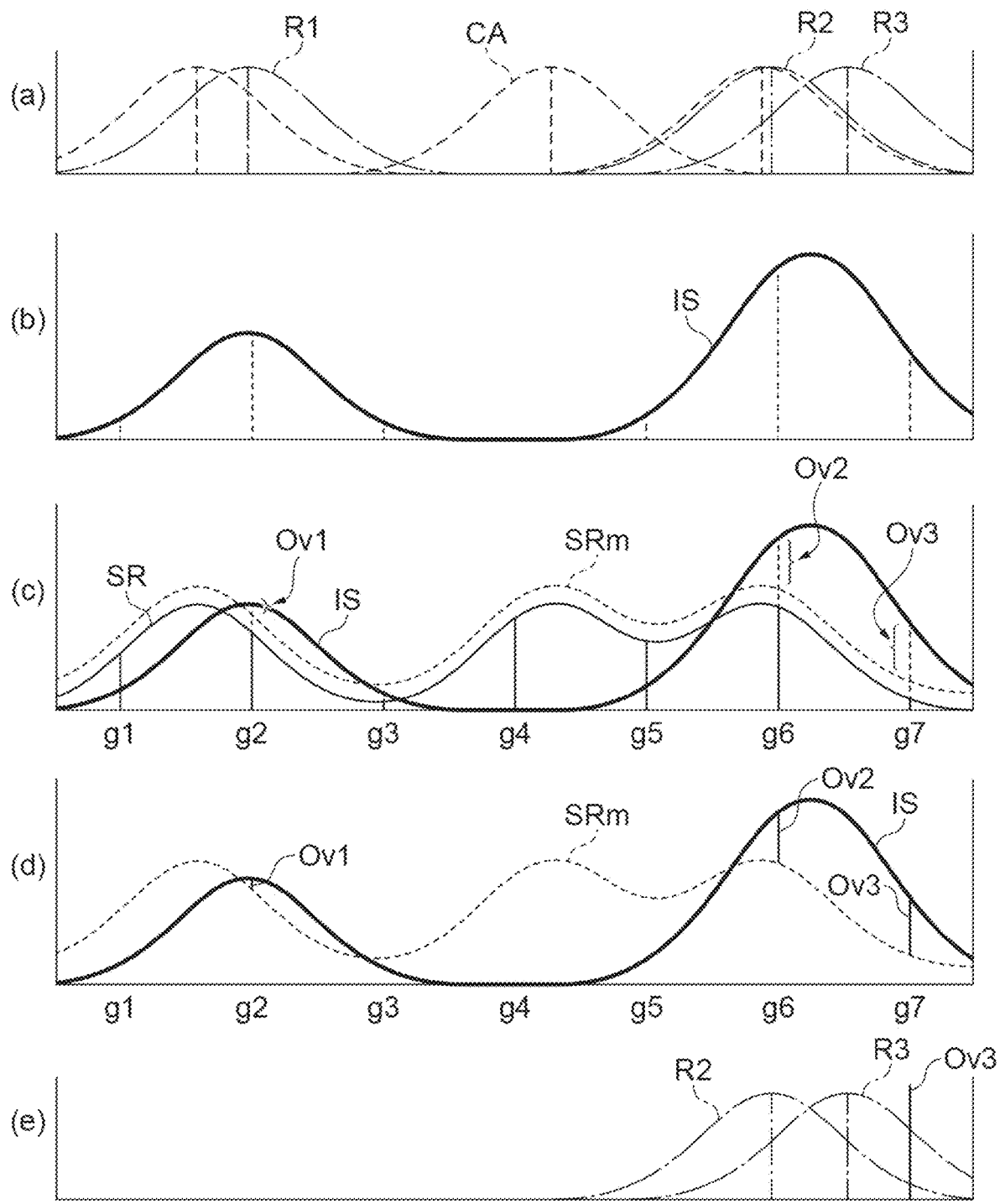
FIG. 16 is a diagram showing a waveform signal separation process.
Figure 17:
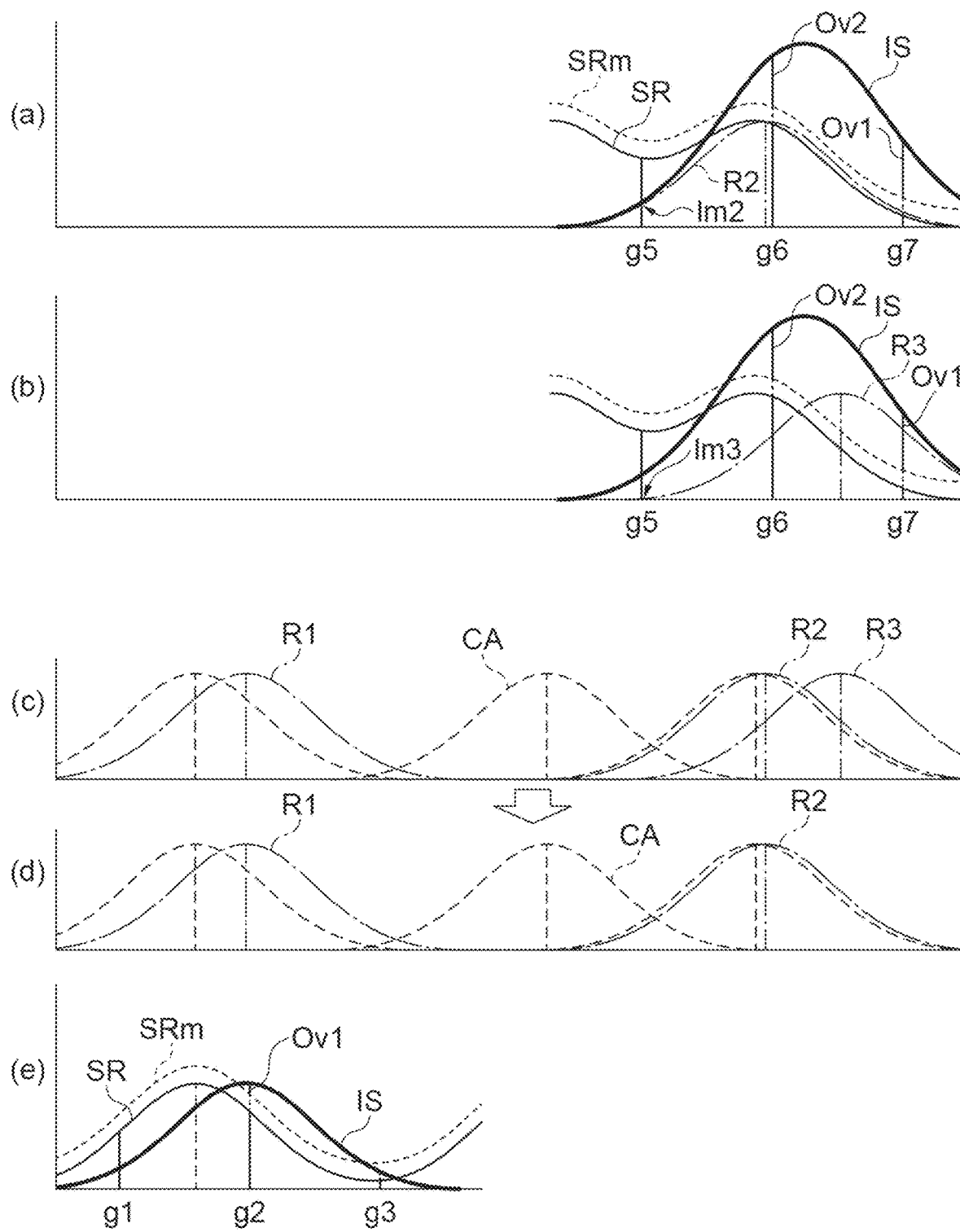
FIG. 17 is a diagram showing the waveform signal separation process.
Figure 18:
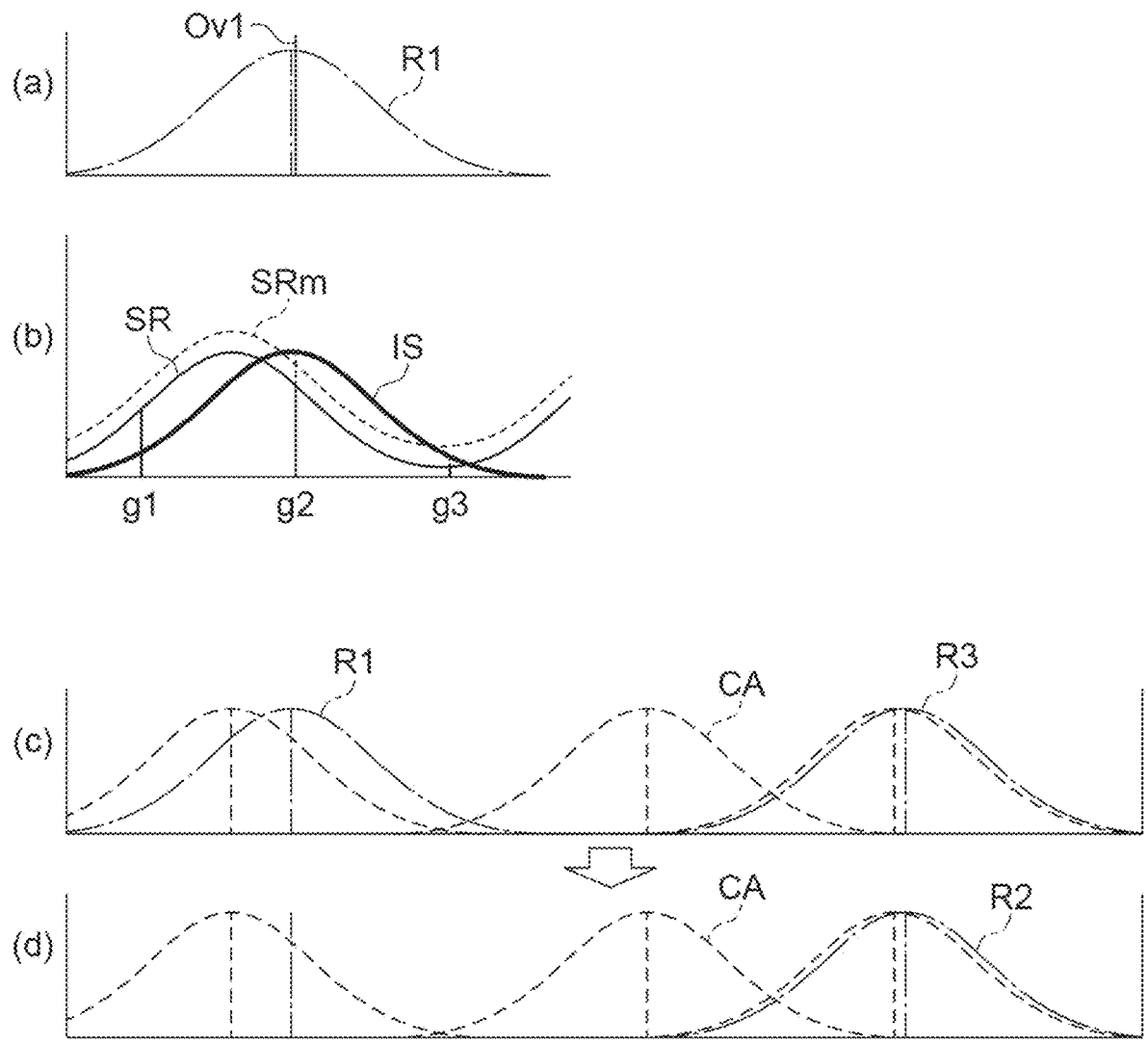
FIG. 18 is a diagram showing the waveform signal separation process.

FIGS. 16, 17, and 18 are diagrams showing the process of separating the waveform signal. In the drawings, a horizontal axis represents the position and a vertical axis represents the wave height. A broken line in the drawings (for example, a broken line shown in FIG. 16(a)) indicates the position and waveform of the correct (actual) drive element. Further, an alternate long and short dash line in the drawings (for example, an alternate long and short dash line shown in FIG. 16(a)) indicates positions and waveforms of randomly set drive element candidates. Further, a thick solid line in the drawings (for example, a thick solid line shown in FIG. 16(b)) shows a waveform of a signal obtained by adding up signals of the randomly set drive element candidates. Further, a thin solid line in the drawings (for example, a thin solid line shown in FIG. 16(c)) is a diagram showing the wave height at each of grid points g1, g2, g3, g4, g5, g6, and g7, and the waveform estimated from each of the wave heights. Further, a dotted line in the drawings (for example, a dotted line shown in FIG. 16(c)) indicates a waveform in which a margin (an a value of variation in consideration of noise) is added to the waveform related to each of the grid points.

For example, as shown in FIG. 16(a), it is assumed that waveforms R1, R2, and R3 are randomly set as the waveforms of the drive element candidates. In this state, the position and waveform CA of the correct (actual) drive element cannot be recognized.

Then, as shown in FIG. 16(b), a total waveform IS showing the influences on the periphery of the drive element candidates is derived by adding up the randomly set waveforms R1, R2, and R3.

FIG. 16(c) shows the wave height at each of the grid points g1, g2, g3, g4, g5, g6, and g7, and a waveform SR estimated from each of the wave heights. Further, FIG. 16(c) shows a waveform SRm in which a margin is added to the waveform SR. Now, when the total waveform IS and the waveform SRm are compared, the grid points g2, g6, and g7 are identified as points at which the total waveform IS exceeds the waveform SRm. Then, over amounts (an amount by which the total waveform IS exceeds the waveform SRm) Ov1, Ov2, and Ov3 at each of the identified grid points g2, g6, and g7 are identified (refer to FIG. 16(d)).

Then, focusing on the grid point g7 of the over amount Ov3 which is the largest one, all the drive element candidates which affect the position thereof are extracted. In this example, as shown in FIG. 16(e), two drive element candidates related to the waveforms R2 and R3 are extracted. Then, with respect to the waveforms R2 and R3 of the two extracted drive element candidates, a degree of influence (the involvement status) at a location (the grid point) at which the total waveform IS does not exceed the waveform SRm is derived.

FIG. 17(a) shows an image of deriving the degree of influence of the drive element candidate related to the waveform R2. FIG. 17(b) shows an image of deriving the degree of influence of the drive element candidate related to the waveform R3. As shown in FIG. 17(a), in the wave height acquired at the grid point g5 at which the total waveform IS does not exceed the waveform SRm, the degree of influence Im2 is a value affected by the waveform R2. Similarly, as shown in FIG. 17(b), in the wave height acquired at the grid point g5 at which the total waveform IS does not exceed the waveform SRm, the degree of influence Im3 is a value affected by the waveform R3. Additionally, when comparing the degree of influence Im2 and the degree of influence Im3, it is clear that the degree of influence Im2 of the waveform R2 is large. In this case, among the waveforms of the originally three drive element candidates as shown in FIG. 17(c), the waveform R3 of the drive element candidate determined to have the small degree of influence by the above comparison is deleted, and as shown in FIG. 17(d), only the waveforms R1 and R2 of the two drive element candidates remain. That is, it is identified that the drive element candidate related to the waveform R3 is incorrect (is not the drive element).

Then, as shown in FIG. 17(e), since the total waveform IS also exceeds the waveform SRm at the grid point g2, the grid point g2 is subsequently focused on, and all the drive element candidates which affect the position thereof are extracted. Now, as shown in FIG. 18(a), the drive element candidate which affects the grid point g2 is only one drive element candidate related to the waveform R1. As shown in FIG. 18(b), when there is one drive element candidate and the total waveform IS exceeds the waveform SRm at a certain grid point (the grid point g2), it is identified that the drive element candidate related to the waveform R1 is incorrect (is not the drive element). In this case, among the waveforms of the originally two drive element candidates as shown in FIG. 18(c), the waveform R1 of the drive element candidate identified as incorrect one is deleted, and as shown in FIG. 18(d), only the waveform R2 of one drive element candidate remains.

The positions of all the drive elements can be estimated by repeating such random setting, determination, and deletion of the drive element candidates. It is possible to estimate the waveform signal of each of the drive elements (to separate the waveform signal of each of the drive elements from the interference waveform) using the above-described method or the like by estimating the position of the drive element. In the above, only the over state is extracted and calculated, but it is also possible to extract and calculate an under state. However, in that case, a method such as calculation being performed in a state in which a sign on the under state side is inverted is required.

In the above, although the method of randomly setting the position of the drive element candidate is disclosed, the position of the drive element may be set by another method. For example, the position of the drive element candidate may be set based on apparatus design rules. Since there is a certain regularity in the design rule of the apparatus, it is possible to shorten a search time for the position of the drive element candidate by applying it. In other words, even in the case of an irregular random logic part, a height of a cell row defined as a width of a power supply line and a ground line is determined by design, but it is not necessary to set the position of the drive element candidate in a power supply/ground part with reference to it. Further, in the case of a design in which elements are regularly disposed, when the position of the initial drive element candidate is determined, it is possible to estimate the positions of other drive element candidates according to the regularity thereof and to proceed with the calculation. Various methods can be applied to the time reduction method using the layout data according to the apparatus design rules.

Further, the control apparatus 20 may reconstruct the waveform signal at an arbitrary position in the light beam spot based on the plurality of interference waveforms. That is, the control apparatus 20 may separate the waveform from the interference waveform for each of the drive elements by the above-described method, and may reconstruct the waveform signal at an arbitrary position in the light beam spot based on information on the separated waveform. It is possible to identify the abnormality occurrence location (the defective position) with higher accuracy by reconstructing the waveform signal at an arbitrary position in this way.

Figure 19:
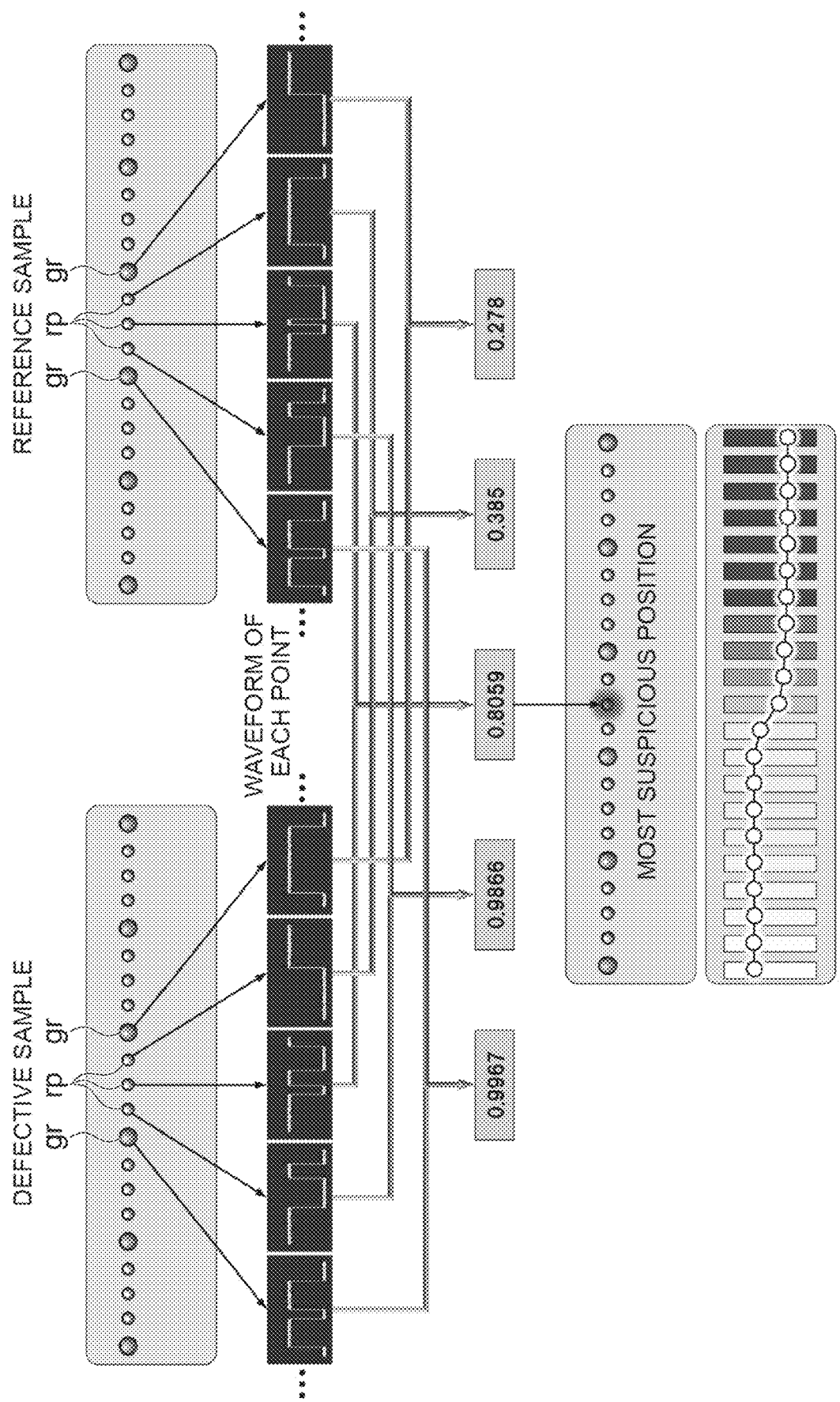
FIG. 19 is a diagram showing a process of identifying an abnormality occurrence location in consideration of a waveform signal reconstructed at an arbitrary position.

FIG. 19 is a diagram showing a process of identifying an abnormality occurrence location in consideration of a waveform signal reconstructed at an arbitrary position. In the example shown in FIG. 19, in a sample suspected of having a defect (the defective sample), a waveform signal is acquired by reconstruction at two grid points gr (probe points) and a waveform reconstruction point rp between the two grid points gr. In addition, similarly, a waveform signal for the same point of the reference sample is acquired by the reconstruction. Then, the waveforms of the same points in the defective sample and the reference sample are compared with each other, and the degree of coincidence of the waveforms is derived for each of the points. Now, when it is assumed that a signal is transmitted from the left side to the right side shown in FIG. 19, and the degree of coincidence of the waveforms as shown in FIG. 19 is obtained, it can be identified that a point (a point at which the degree of coincidence of the waveforms is 0.8059) on the most upstream side (the left side) in a state in which the degree of coincidence of the waveforms is deteriorated is the abnormality occurrence location. Such an abnormality occurrence location is, for example, a location at which a defect is present in a wiring or via coupled to the drive element (the transistor) at the location. On the monitor 30 (details will be described later), as shown in FIG. 19, the point suspected to be the abnormality occurrence location may be displayed in color or may be displayed in a graph of a correlation coefficient.

Figure 20:
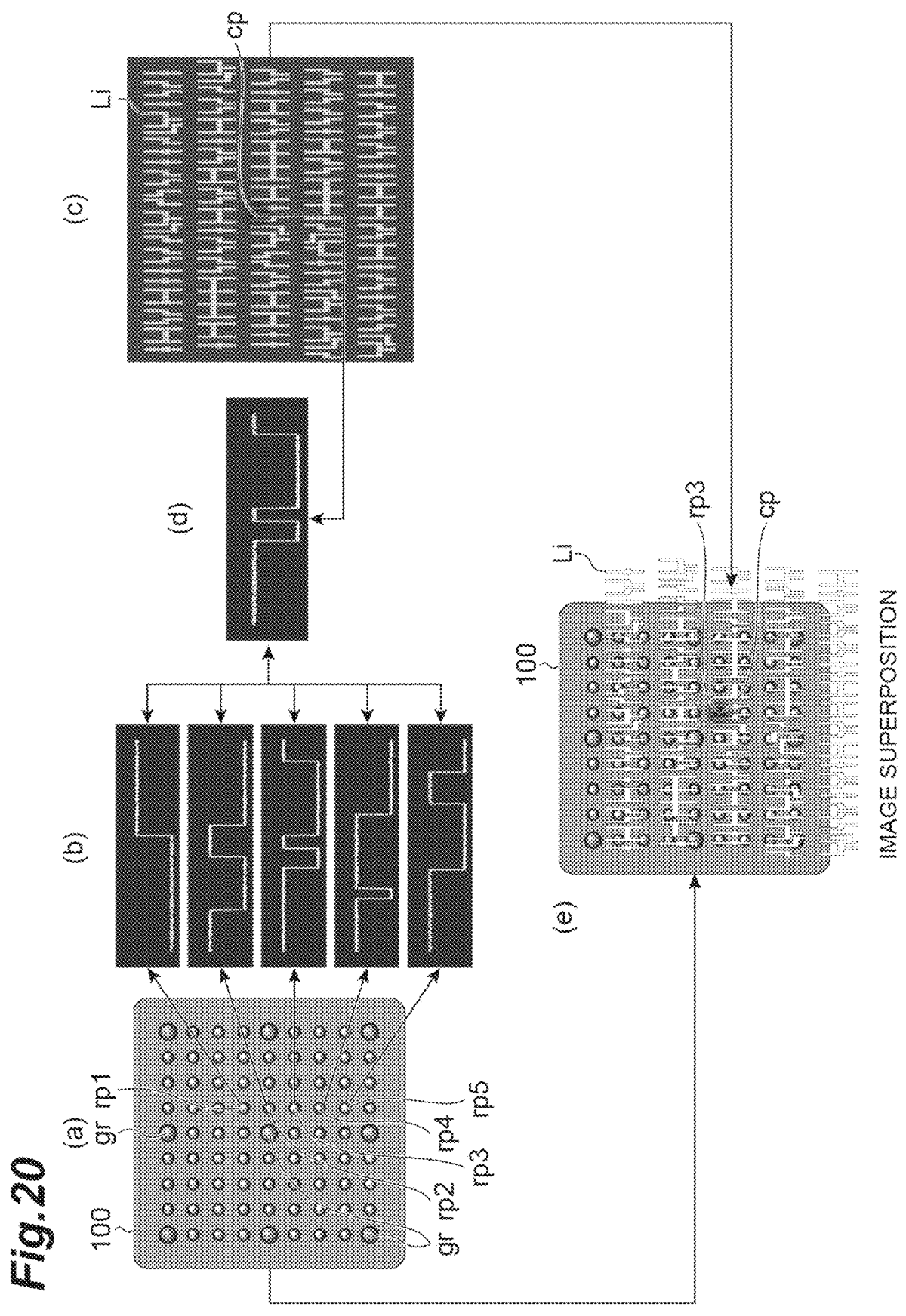

Further, when the waveform is separated based on the interference waveform, and the waveform signal at an arbitrary position is reconstructed, the control apparatus 20 may further perform alignment between the semiconductor apparatus 100 and a layout image Li of the semiconductor apparatus based on comparison results between a waveform signal after separation and a waveform signal generated by a logic simulation (refer to FIG. 20). The layout image Li of the semiconductor apparatus is, for example, a CAD image.

FIG. 20 is a diagram showing the alignment between the semiconductor apparatus 100 and the layout image Li. As shown in FIG. 20(a), for the semiconductor apparatus 100, it is assumed that the waveform signals at arbitrary positions rp1, rp2, rp3, rp4, and rp5 are reconstructed based on the interference waveforms acquired at a plurality of grid points gr (refer to FIG. 20(b)). Further, it is assumed that a logic simulation waveform shown in FIG. 20(d) is acquired for a center point cp of the layout image Li shown in FIG. 20(c). Now, the logic simulation waveform of FIG. 20(d) has a high degree of coincidence with the waveform of the position rp3 of the semiconductor apparatus 100 (refer to FIG. 20(b)). From this, the semiconductor apparatus 100 and the layout image Li of the semiconductor apparatus can be accurately aligned with each other by superimposing the layout image Li on the image of the semiconductor apparatus 100 so that the center point cp of the layout image Li coincides with the position rp3 of the semiconductor apparatus 100, as shown in FIG. 20(e).

When the position of the drive element is identified in the process of separating the waveform signal, the control apparatus 20 may perform the alignment between the semiconductor apparatus 100 and the layout image based on the position of each of the identified drive element.

Figure 21:
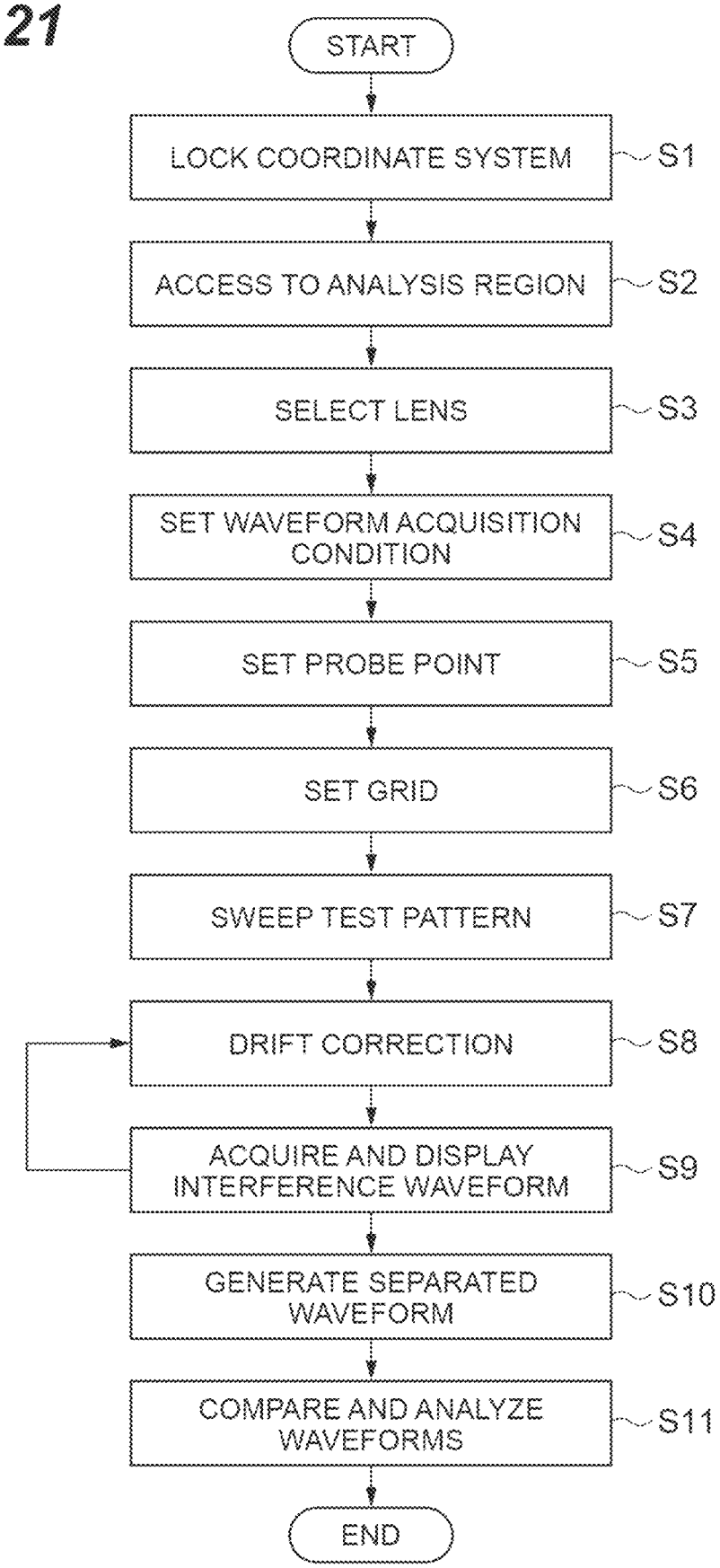
FIG. 21 is a flowchart showing a process related to a semiconductor apparatus examination method performed by the semiconductor apparatus examination apparatus.
Figure 22:
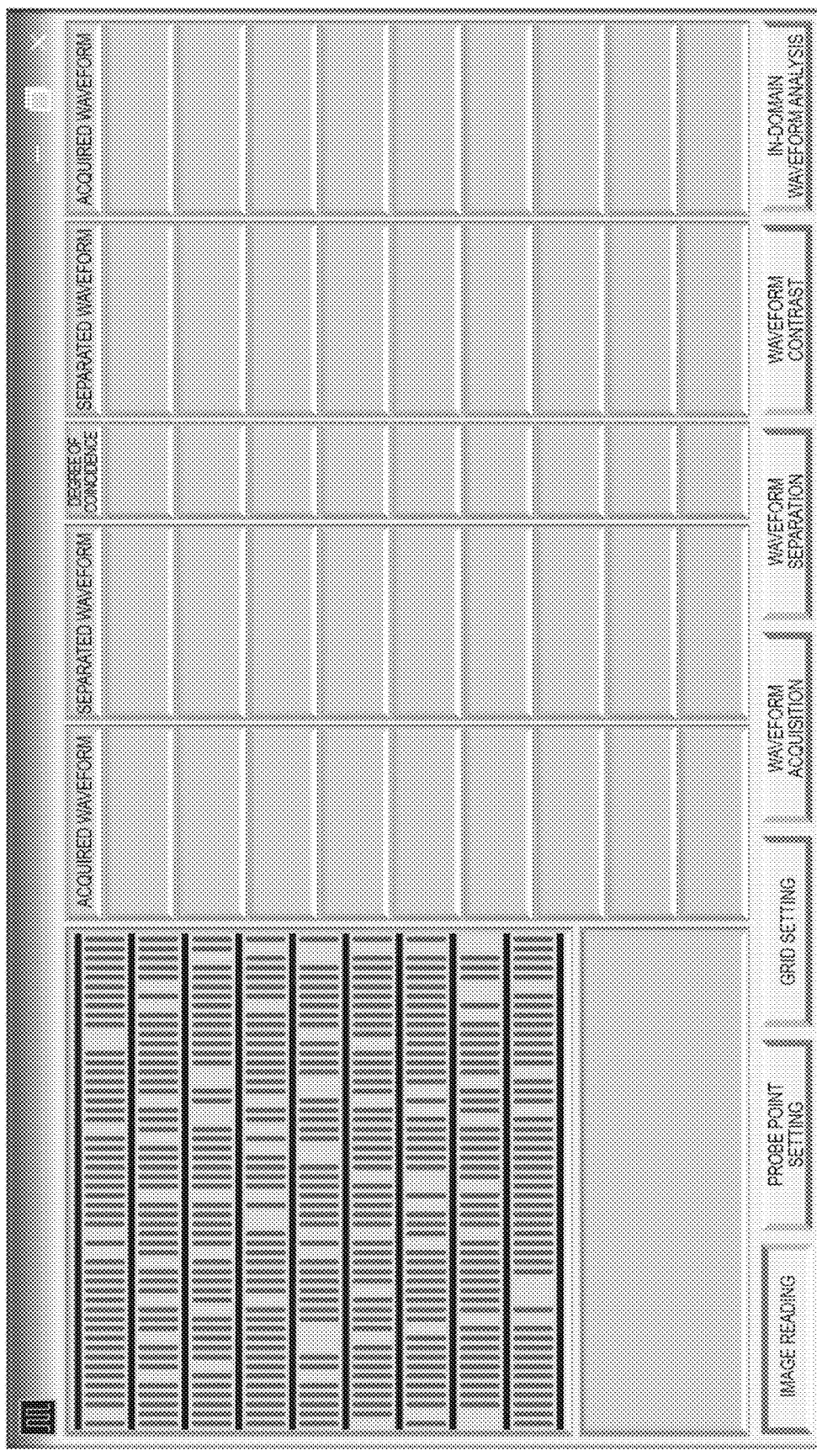
FIG. 22 is an example of a screen image on a monitor.

Next, a process related to a semiconductor apparatus examination method performed by the semiconductor apparatus examination apparatus 1 will be described with reference to FIG. 21. FIG. 21 is a flowchart showing a process related to the semiconductor apparatus examination method performed by the semiconductor apparatus examination apparatus 1. In the description of each process, an example of a screen image on the monitor 30 (FIGS. 22 to 30) will also be described.

As shown in FIG. 21, first, an image of the semiconductor apparatus 100 of the first sample is read and displayed on the monitor 30 (refer to FIG. 22), and a coordinate system is locked based on a coordinate system of the semiconductor apparatus 100 and a coordinate system of the layout image (Step S1). In the example shown in FIG. 22, although the image of the semiconductor apparatus 100 is displayed in a graphical user interface (GUI) for waveform analysis, it may be displayed in various existing windows without being read in the GUI to set a probing position and the like. Subsequently, an analysis region of the semiconductor apparatus 100 is accessed (Step S2), and an appropriate lens is selected (Step S3). Subsequently, waveform acquisition conditions are set in the control apparatus 20 (Step S4).

Figure 23:
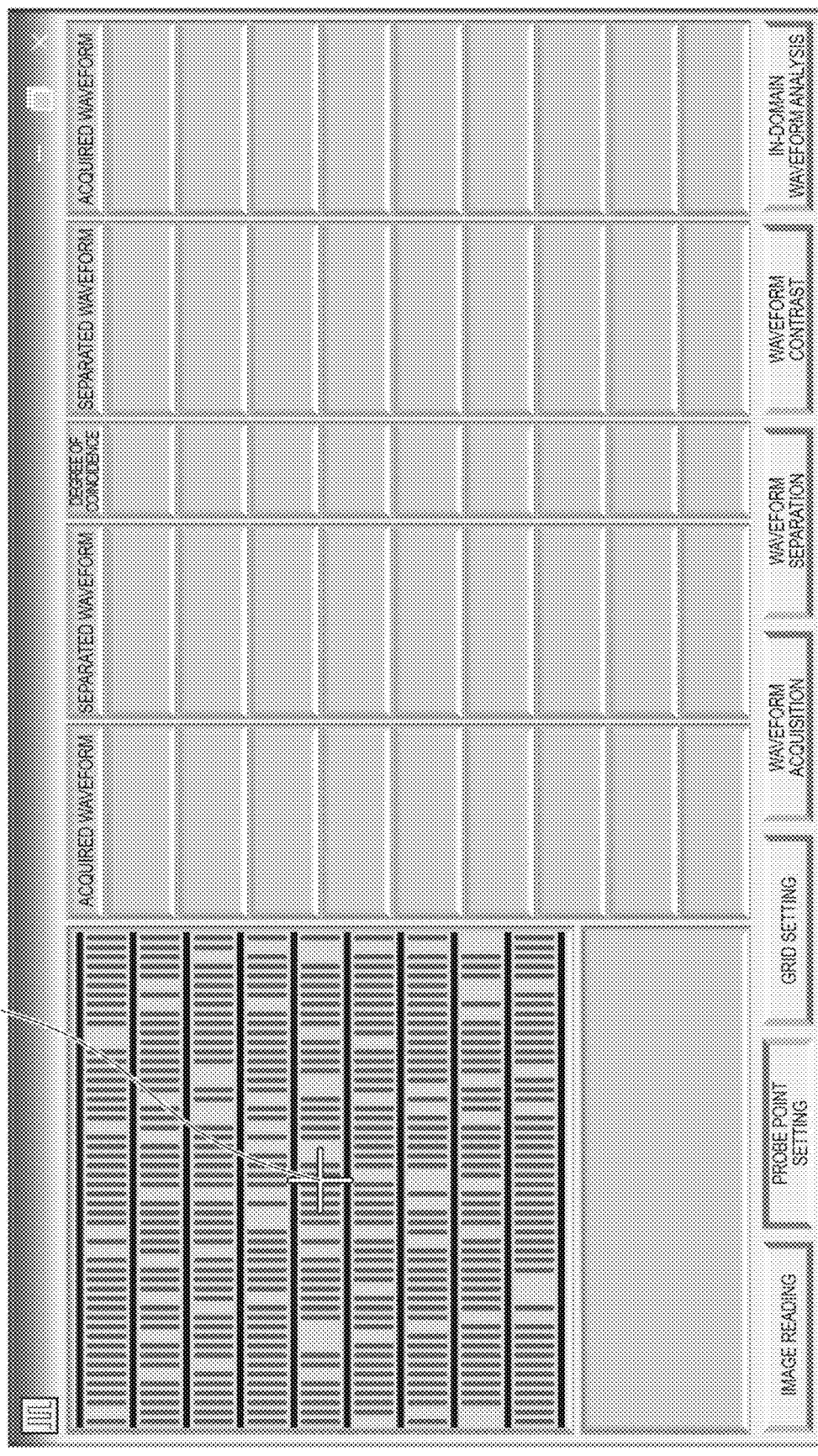
FIG. 23 is an example of the screen image on the monitor.
Figure 24:
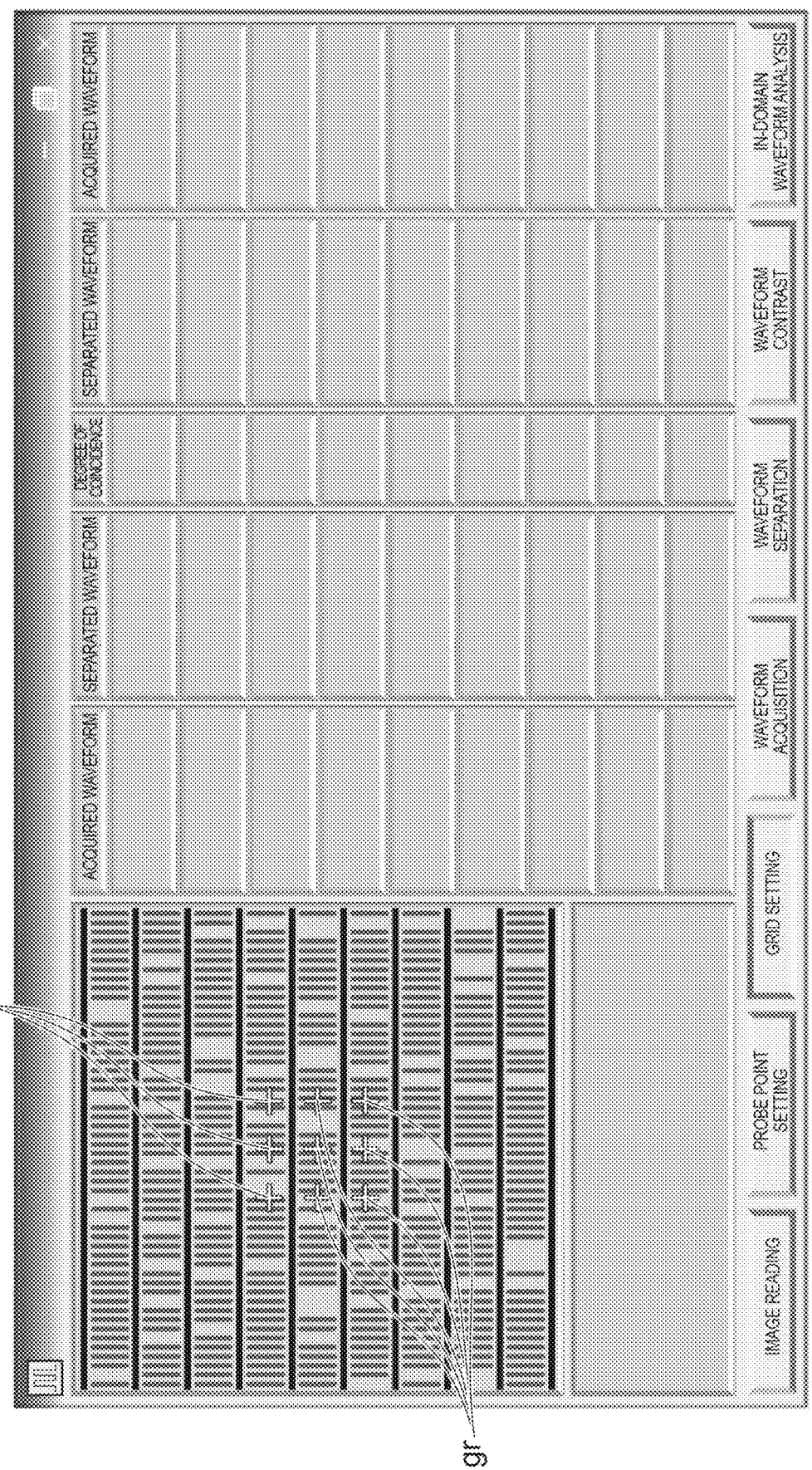
FIG. 24 is an example of the screen image on the monitor.
Figure 25:
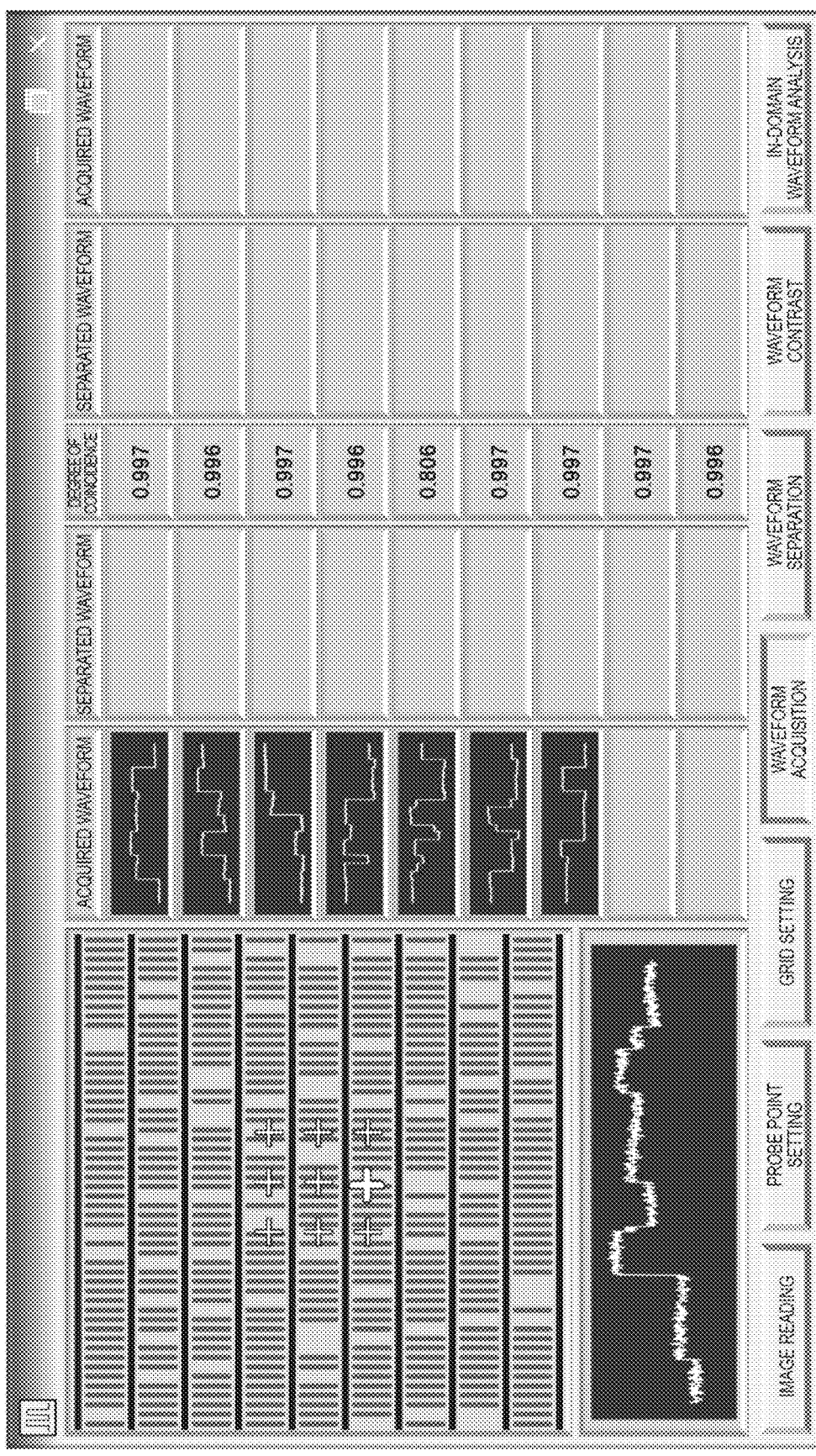
FIG. 25 is an example of the screen image on the monitor.

Subsequently, a target drive element (or a group of target drive elements) is set to be a probe point pp (refer to FIG. 23) (Step S5). As shown in FIG. 23, each process such as setting the probe point pp is performed by pressing a setting button (for example, a "probe point setting" button). In FIG. 23, an image close to a layout pattern is shown, but an LSM image may actually be displayed.

Subsequently, the grid point gr (refer to FIG. 24) is set to surround the probe point pp (Step S6). A pop-up for inputting an X pitch and a Y pitch of the grid point may be displayed on the monitor 30 by pressing the "grid setting" button. An input value in this case may be selected from a plurality of numerical values stored in advance, or may be a value arbitrarily input by a user. Further, the number of vertical and horizontal grids may also be input by the user. In this case, the number of waveforms (the number of lines) displayed on the right side of FIG. 24 may change according to the number of grids. In the example shown in FIG. 24, since the number of grids is 9, the number of displayed waveforms (the number of lines) is set to 9.

Subsequently, a voltage pattern (a test pattern) is swept to the semiconductor apparatus 100 (Step S7), and a drift correction is performed (Step S8). The drift correction may be performed on a screen different from a waveform display screen on the monitor 30.

Subsequently, the interference waveforms based on signals from the plurality of drive elements are acquired according to the light from each of the grid points gr, and are respectively displayed in a column for the acquired waveforms (refer to FIG. 25) on the monitor 30 (Step S9). The interference waveforms are acquired sequentially. The control apparatus 20 may shape the acquired interference waveform (EPO waveform) by performing noise removal filtering using deep learning or the like. The Steps S8 and S9 may be performed repeatedly for all the set grid points.

Figure 26:
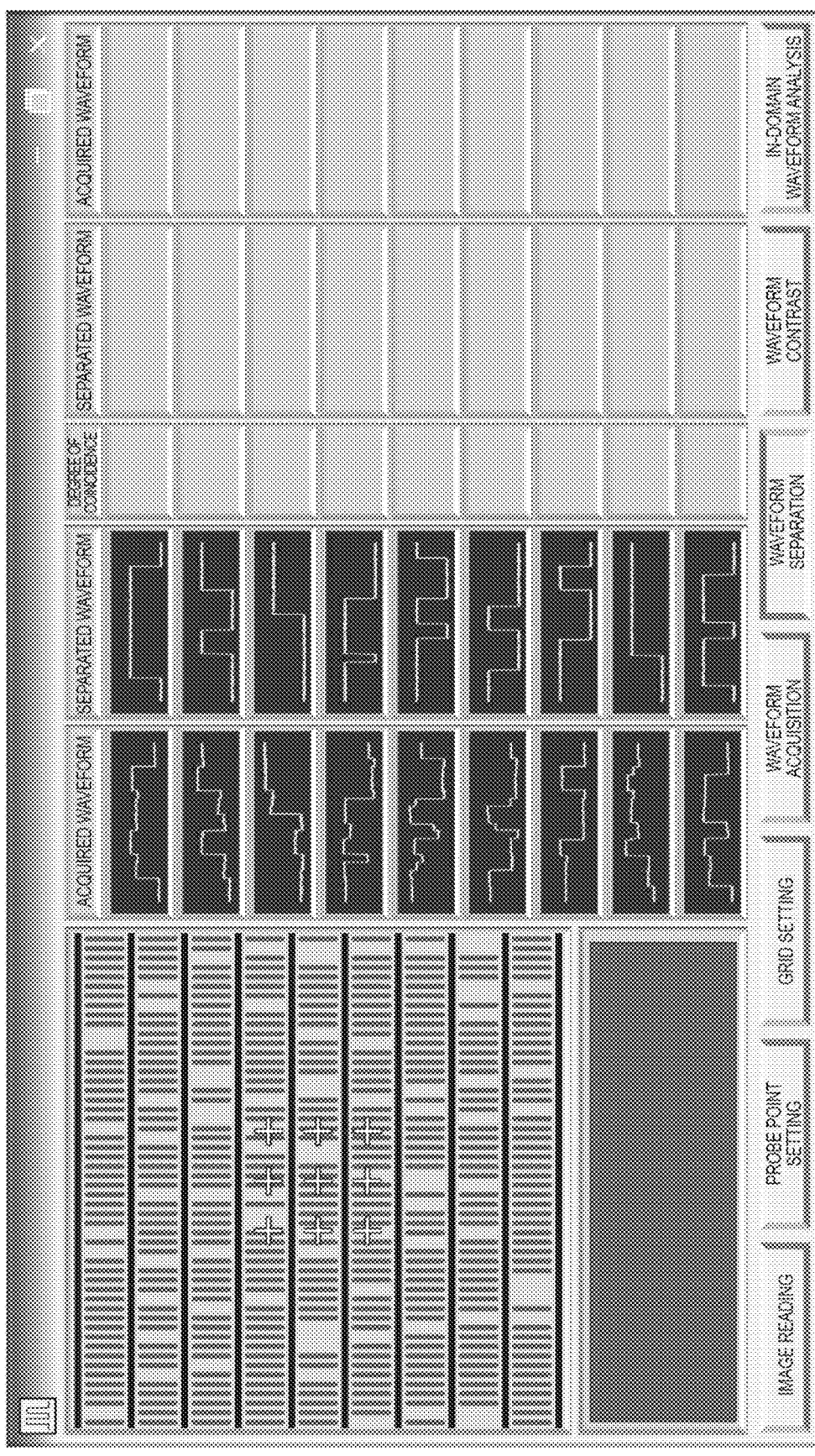
FIG. 26 is an example of the screen image on the monitor.
Figure 27:
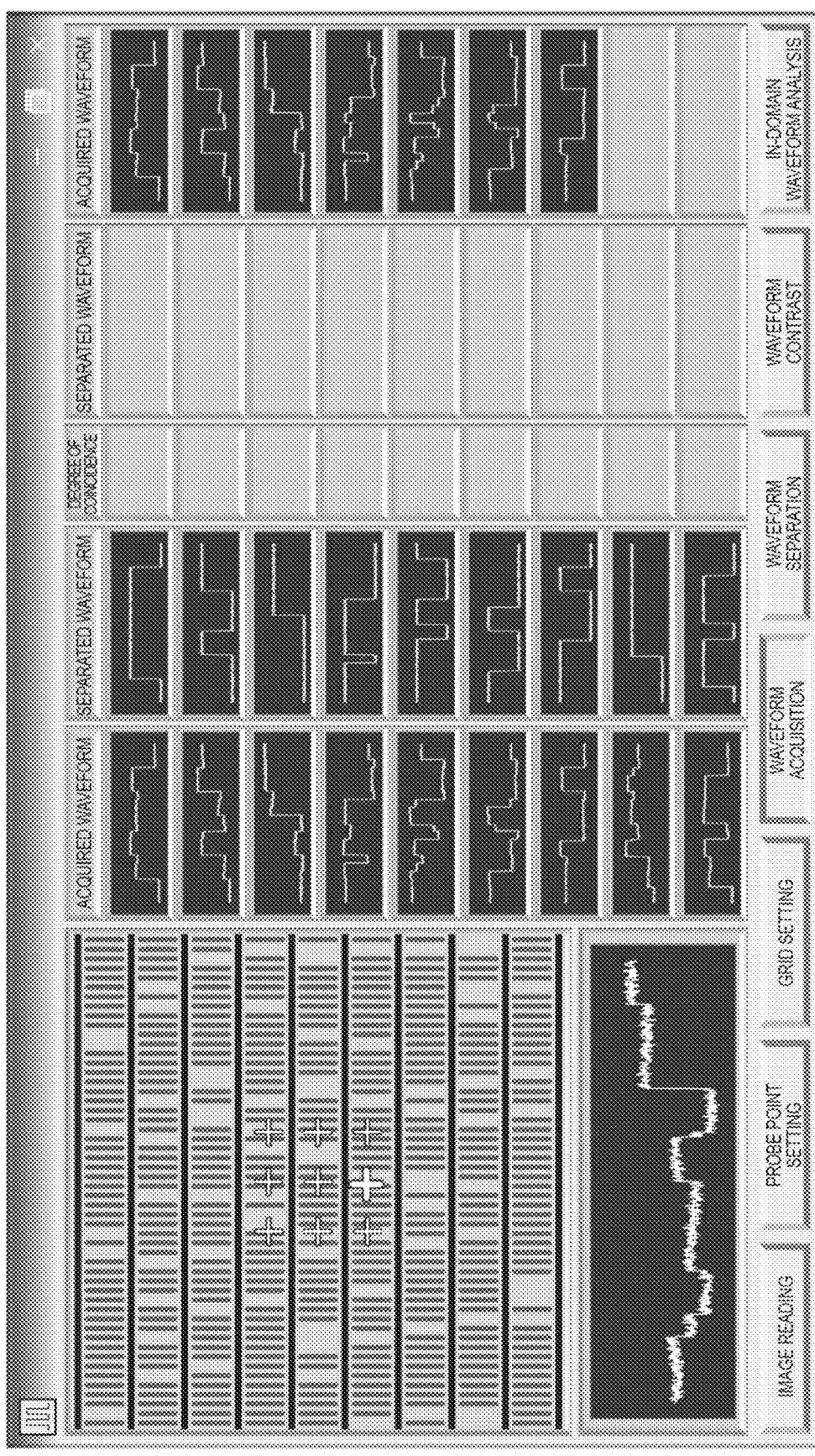
FIG. 27 is an example of the screen image on the monitor.

Subsequently, the waveform signal is separated for each of the drive elements based on the plurality of interference waveforms (Step S10). Each of the separated waveform signals is displayed in a column of the separated waveforms on the monitor 30 as shown in FIG. 26. The number of lines of the separated waveform on the monitor 30 changes according to the number of drive elements. The waveform is not necessarily limited to being separable at each of the grid points gr, and a process of reconstructing the waveform at an arbitrary location between the grids may be performed to pick up a location with the least interference.

Figure 28:
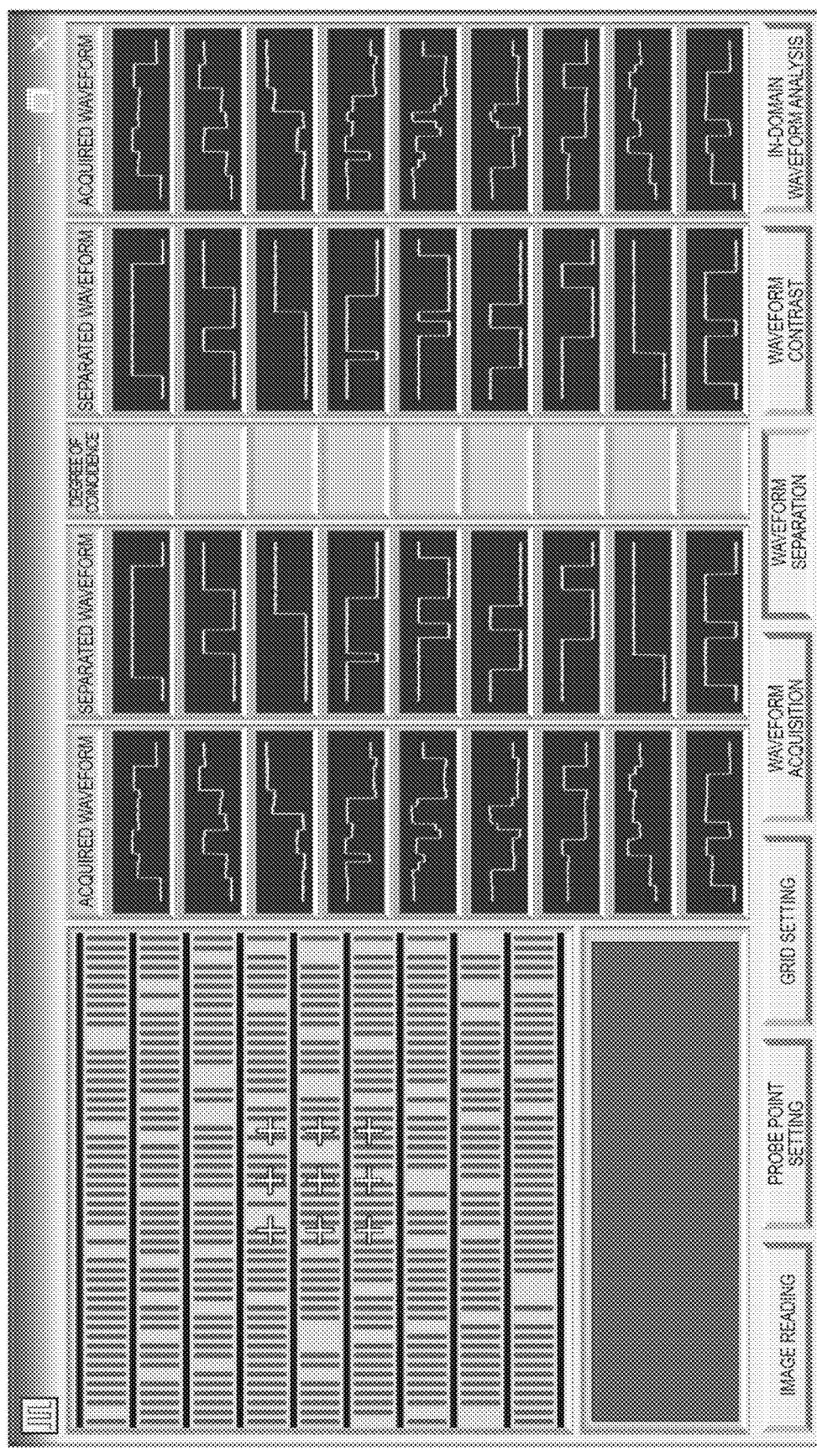
FIG. 28 is an example of the screen image on the monitor.

Then, for a semiconductor apparatus of the second sample, the interference waveform is acquired and displayed in the same manner as in the first sample (refer to FIG. 27), and the waveform signal is separated based on the interference waveform (refer to FIG. 28). In this case, the first sample may be the defective sample and the second sample may be the reference sample, or the first sample may be the reference sample and the second sample may be the defective sample. As shown in FIG. 28, the monitor 30 arranges and displays the separated waveform signal and the reference waveform signal.

Figure 29:
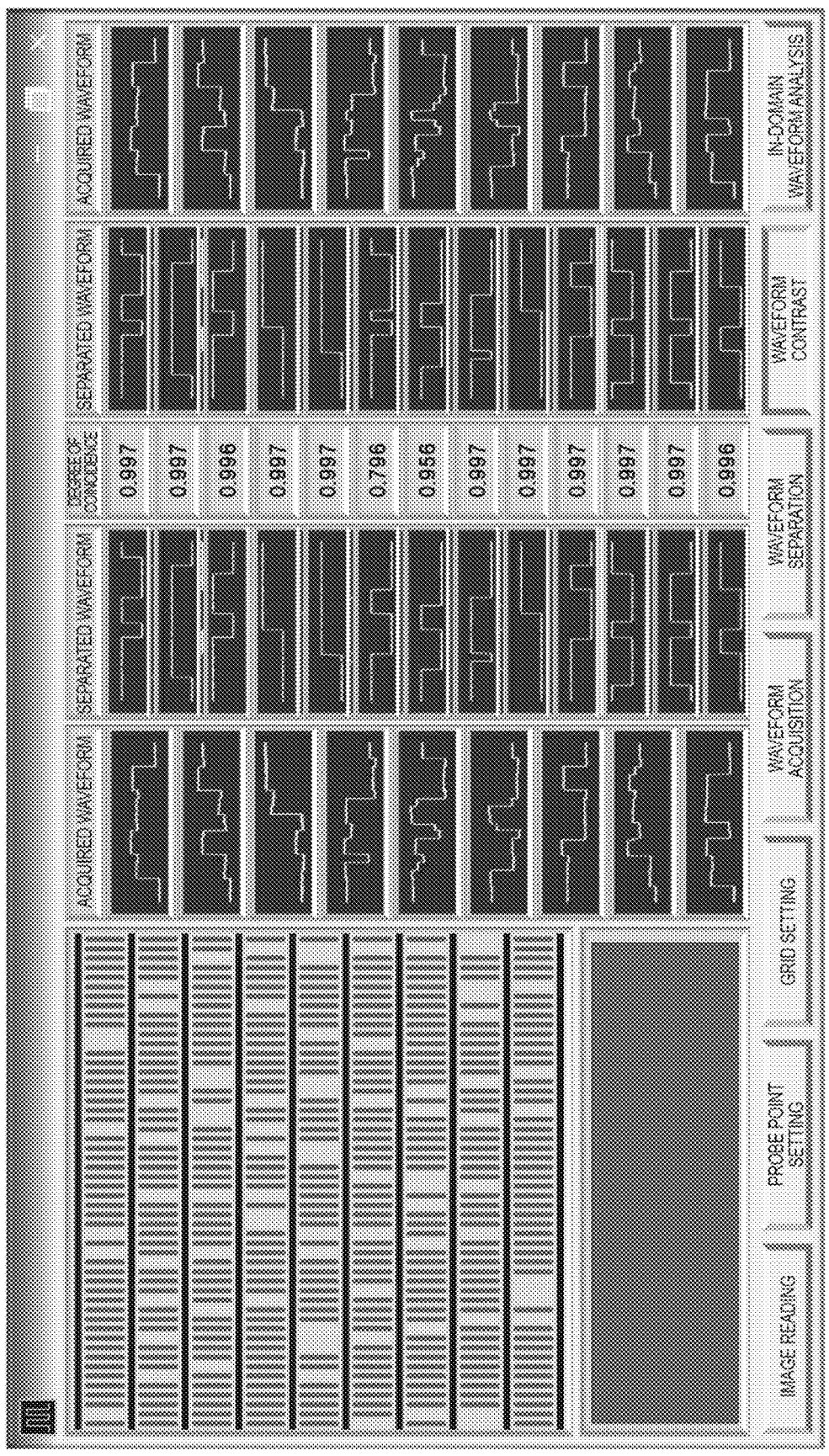
FIG. 29 is an example of the screen image on the monitor.

Subsequently, the control apparatus 20 compares the waveforms with respect to the same point of the two samples, derives the degree of coincidence for each point, and displays the degree of coincidence on the monitor 30 (refer to FIG. 29). Then, the waveform is analyzed in consideration of the degree of coincidence (Step S11), and the abnormality occurrence location (defective position) is identified. In the example shown in FIG. 29, for example, a position at which the degree of coincidence is 0.796 is identified as the abnormality occurrence location.

Figure 30:
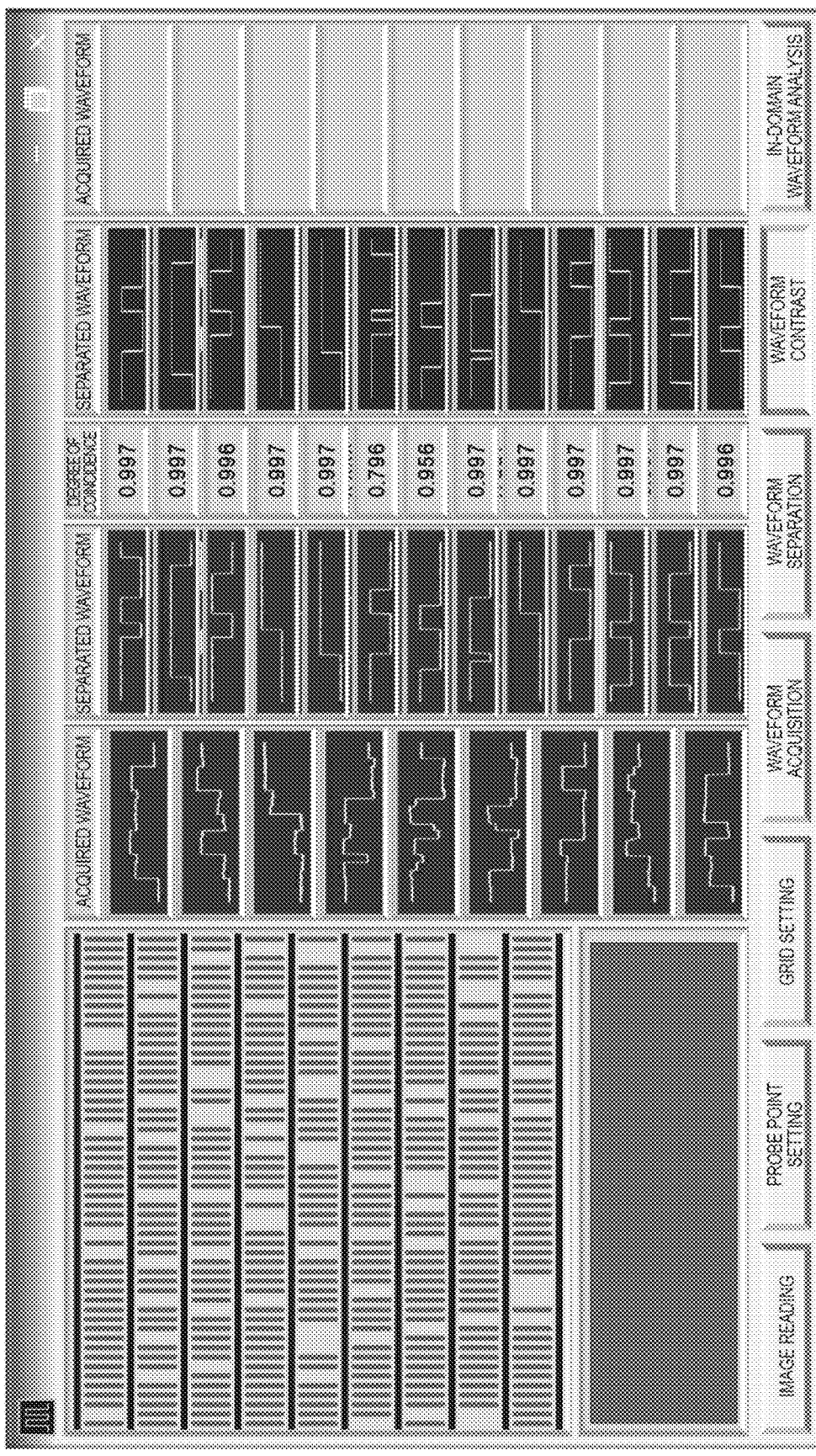
FIG. 30 is an example of the screen image on the monitor.

Instead of the method of acquiring the waveforms from the two samples described above and contrasting them with each other, a logic simulation waveform may be provided as a reference waveform (refer to FIG. 30). That is, the monitor 30 may arrange and display the separated waveform signal and the logic simulation. In this case, the process can be simplified as compared with the case of acquiring the waveforms with two samples.

Next, operations and effects of the semiconductor apparatus examination apparatus 1 and the semiconductor apparatus examination method according to the first embodiment will be described.

The semiconductor apparatus examination method according to the present embodiment includes a step of acquiring a first interference waveform based on signals from a plurality of drive elements according to light from a first light beam spot including the plurality of drive elements in a semiconductor apparatus 100, a step of acquiring a second interference waveform based on signals from the plurality of drive elements according to light from a second light beam spot of which a region partially overlaps the first spot and which includes the plurality of drive elements, and a step of separating a waveform signal for each of the drive elements in the first and second spots based on the first and second interference waveforms.

In such a semiconductor apparatus examination method, the first interference waveform based on the light from the first light beam spot including the plurality of drive elements, and the second interference waveform based on the light from the second light beam spot of which the region partially overlaps the first light beam spot and which includes the plurality of drive elements are acquired, and the waveform signal is separated for each of the drive elements in the first and second light beam spots based on the first and second interference waveforms. It is possible to estimate a degree of influence (a state of involvement of a signal of each of the drive elements in each of the interference waveforms) according to positions of the plurality of drive elements included in the light beam spot related to the interference waveform, for example, by acquiring a time change of the interference waveform of each of the light beam spots of which regions overlap each other. It is possible to appropriately separate the waveform signal of each of the drive elements in the light beam spot from the interference waveform by considering the degree of influence according to the positions of the plurality of drive elements. In this way, when the waveform signal (the original waveform) of each of the drive elements is appropriately separated from the interference waveform, the semiconductor apparatus examination can be performed with high accuracy based on the waveform signal of the drive element after separation.

The above-described semiconductor apparatus examination method includes a step of arranging and displaying a waveform signal after separation and a reference waveform signal of the semiconductor apparatus or a waveform signal generated by a logic simulation. Thus, at the time of examination of the semiconductor apparatus 100, a difference from the reference sample (the reference waveform signal of the semiconductor apparatus or the waveform signal generated by the logic simulation) can be displayed to the user in an easy-to-understand manner. Thus, the semiconductor apparatus examination can be performed with higher accuracy.

The above-described semiconductor apparatus examination method further includes a step of comparing the waveform signal after separation with the reference waveform signal of the semiconductor apparatus or the waveform signal generated by the logic simulation. Thus, at the time of examination of the semiconductor apparatus 100, it is possible to identify the difference from the reference sample (the reference waveform signal of the semiconductor apparatus or the waveform signal generated by the logic simulation). Thus, the semiconductor apparatus examination can be performed with higher accuracy.

The above-described semiconductor apparatus examination method further includes a step of performing alignment between the semiconductor apparatus 100 and a layout image of the semiconductor apparatus 100 based on comparison results between the waveform signal after separation and the waveform signal generated by the logic simulation. Thus, the alignment is performed based on a degree of similarity of the waveform signals, and after the alignment, the semiconductor apparatus examination (identification of a failure position, and the like) can be performed with higher accuracy based on the layout image.

The above-described semiconductor apparatus examination method further includes a step of identifying a position of each of the drive elements in the first and second light beam spots based on the waveform signal after separation, and performing the alignment between the semiconductor apparatus 100 and the layout image of the semiconductor apparatus 100 based on the identified position of each of the drive elements. The alignment can be performed more easily as compared with a case of comparing the waveform signals by performing the alignment based on the positions of the drive elements, and after the alignment, the semiconductor apparatus examination (the identification of the failure position, and the like) can be performed with higher accuracy based on the layout image.

In the above-described semiconductor apparatus examination method, a separation distance between a center of the first light beam spot and a center of the second light beam spot is four times or less a separation distance between gates constituting the drive elements. Thus, the waveform according to the light from the first light beam spot and the waveform according to the light from the second light beam spot can be appropriately set to the interference waveforms (the first interference waveform based on signals from the plurality of drive elements and the second interference waveform based on signals from the plurality of drive elements).

The above-described semiconductor apparatus examination method further includes a step of performing noise removal filtering on the first and second interference waveforms. It is possible to appropriately separate the waveform signal based on the interference waveform from which noise is removed by removing the noise using, for example, deep learning, or the like.

The above-described semiconductor apparatus examination method further includes a step of reconstructing a waveform signal at an arbitrary position in the first and second spots based on the first and second interference waveforms. Thus, not only the waveform signal of the drive element (the waveform signal separated from the interference waveform) can be acquired, but also the waveform signal at an arbitrary position can be acquired based on the separated waveform signal.

The above-described semiconductor apparatus examination method further includes a step of irradiating the first and second light beam spots with light, and a step of detecting light from the first light beam spot which is reflected light with respect to the light radiated to the first light beam spot and light from the second light beam spot which is the reflected light with respect to the light radiated to the second light beam spot. Thus, according to the reflected light, the semiconductor apparatus examination can be performed with high accuracy using an optical probing technique such as EOP.

Second Embodiment

Next, a second embodiment of the present invention will be described. In the second embodiment, differences from the first embodiment will be mainly described.

In the second embodiment, the semiconductor apparatus examination apparatus 1 examines the semiconductor apparatus 100 by time resolved emission microscopy (TREM). The TREM is a method in which light emission at the time of on/off or off/on transition of a transistor of which a gate passes through an intermediate potential by operating the semiconductor apparatus 100 is detected, and an analysis is performed based on a detection timing of the light emission. The light emission is generated when a voltage pattern (an operation pulse signal) is swept to a gate 100a of the semiconductor apparatus 100 and the voltage passes through the intermediate potential. The semiconductor apparatus examination apparatus 1 according to the present embodiment includes a high-sensitivity detector such as a superconducting nanowire single photon detector (SSPD) as the photodetector 16. Then, in the semiconductor apparatus examination apparatus 1, the light source 11 irradiates the semiconductor apparatus 100 with excitation light, and the photodetector 16 detects the light emission (fluorescence) from the semiconductor apparatus 100 according to the excitation light.

Figure 31:
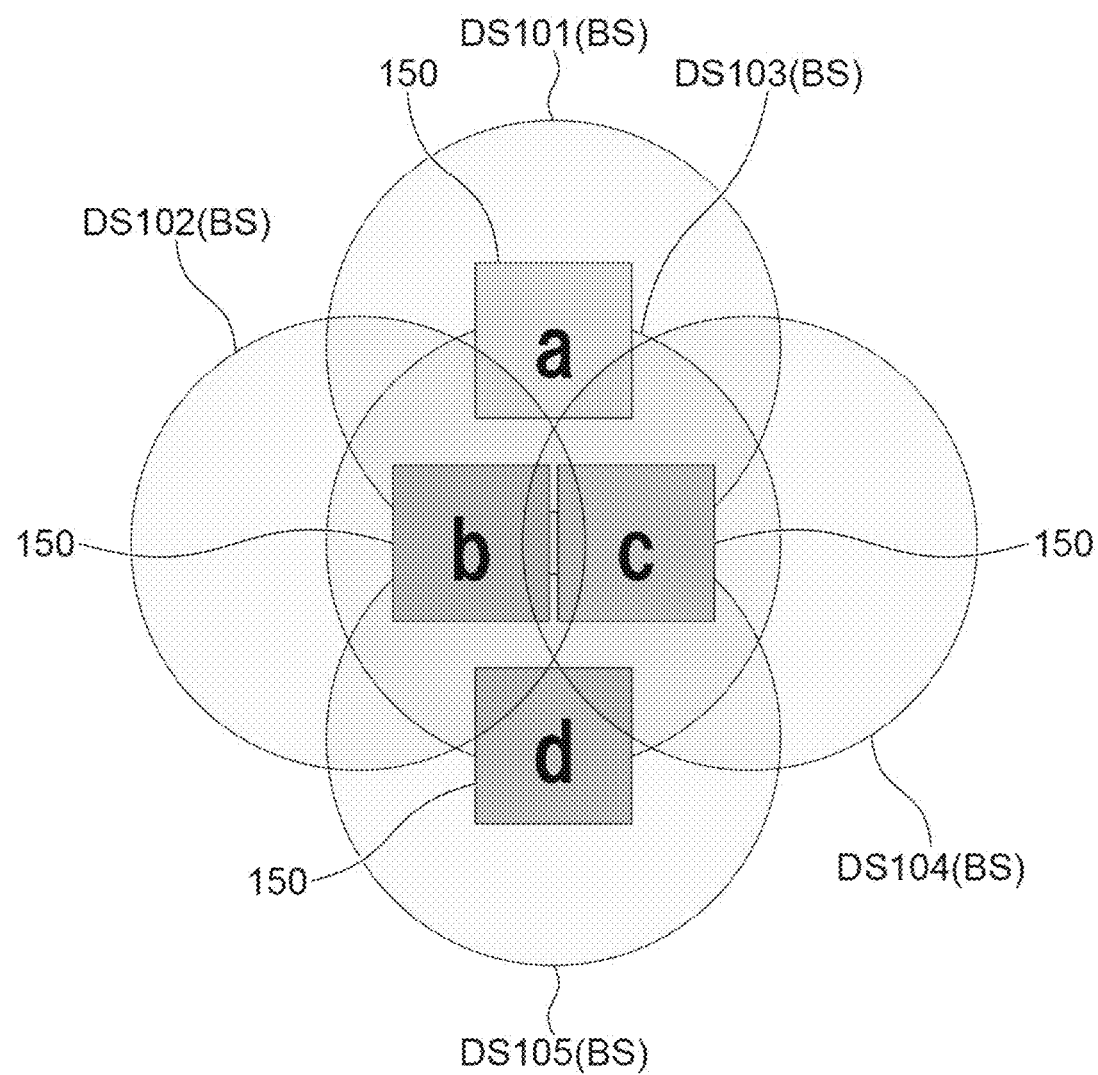
FIG. 31 is a diagram showing a setting example of a light beam spot.

FIG. 31 is a diagram showing a setting example of a photodetection spot DS. Now, as shown in FIG. 31, it is assumed that photodetection spots DS101, DS102, DS103, DS104, and DS105 are set so that a part of each region overlaps each other. Additionally, the photodetection spot DS101 straddles drive elements 150 represented by an "element a", an "element b", and an "element c", the photodetection spot DS102 straddles the drive elements 150 represented by the "element a", the "element b", the "element c", and an "element d", the photodetection spot DS103 straddles the drive elements 150 represented by the "element a", the "element b", the "element c", and the "element d", the photodetection spot DS104 straddles the drive elements 150 represented by the "element a", the "element b", the "element c", and the "element d", and the photodetection spot DS105 straddles the drive elements 150 represented by the "element b", the "element c", and the "element d".

Due to the positional relationship of the interference waveform acquired according to the light emission from the photodetection spot 101, the influence of the "element a" is the largest, and the influence of each of the "element b" and the "element c" is about the same. Due to the positional relationship of the interference waveform acquired according to the light emission from the photodetection spot 102, the influence of the "element b" is the largest, the influence of the "element a" and the "element d" is the second largest, and the influence of the "element c" is the smallest. Due to the positional relationship of the interference waveform acquired according to the light emission from the photodetection spot 103, the influence of the "element b" and the "element c" is the largest, and the influence of each of the "element a" and the "element d" is about the same. Due to the positional relationship of the interference waveform acquired according to the light emission from the photodetection spot 104, the influence of the "element c" is the largest, the influence of each of the "element a" and the "element d" is the second largest, and the influence of the "element b" is the smallest. Due to the positional relationship of the interference waveform acquired according to the light emission from the photodetection spot 105, the influence of the "element d" is the largest, and the influence of each of the "element b" and the "element c" is about the same.

Figure 32:
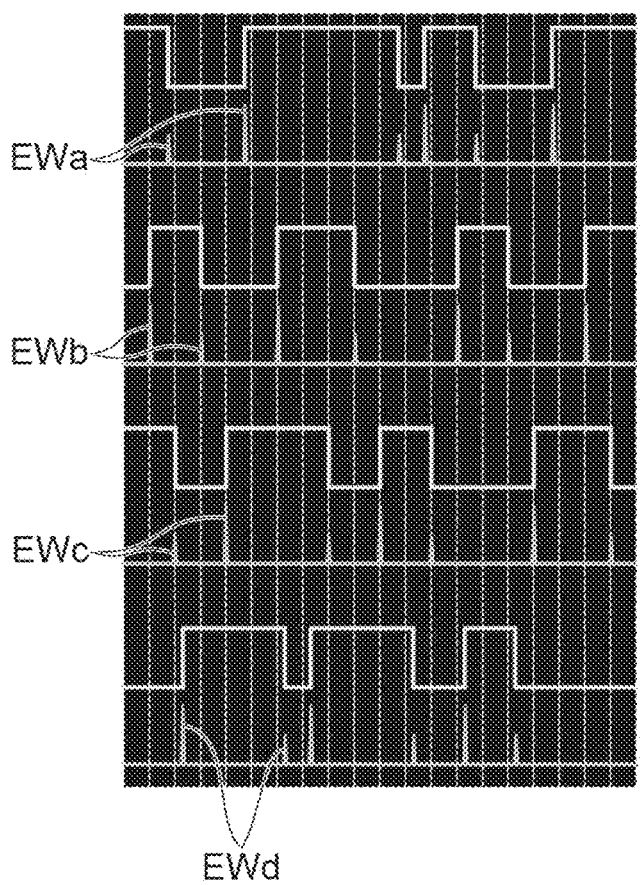
FIG. 32 is a diagram showing an operation timing of each drive element.

Here, a timing at which the operation pulse signal arrives (that is, an operation timing, an operation clock) differs according to a position and a circuit configuration of each of the drive elements 150 (the "element a", the "element b", the "element c", and the "element d"). FIG. 32 is a diagram showing the operation timing of each of the drive elements 150. FIGS. 32($a$) to 32($d$) show the waveform (on the upper side) and the light emission waveform (on the lower side) of each of the drive elements 150. Further, in FIGS. 32($a$) to 32($d$), a broken line indicates a basic clock of the operation pulse signal. As shown in FIG. 32($a$), the light emission in the "element a" is detected earlier than the basic clock (the broken line). Further, as shown in FIGS. 32($b$) and 32($c$), the light emission in the "element b" and "element c" is detected at the same timing as the basic clock. Further, as shown in FIG. 32($d$), the light emission in the "element d" is detected later than the basic clock. The semiconductor apparatus examination apparatus 1 according to the present embodiment focuses on such a difference in the operation timing for each of the drive elements 150, and separates the waveform signal of each of the drive elements 150 from the interference waveform. That is, in the semiconductor apparatus examination apparatus 1 of the second embodiment, the control apparatus 20 is configured to acquire the interference waveform, and to perform the separation of the waveform signal of each of the drive elements from the interference waveform based on the operation timings of the plurality of drive elements related to the interference waveform.

Figure 33:
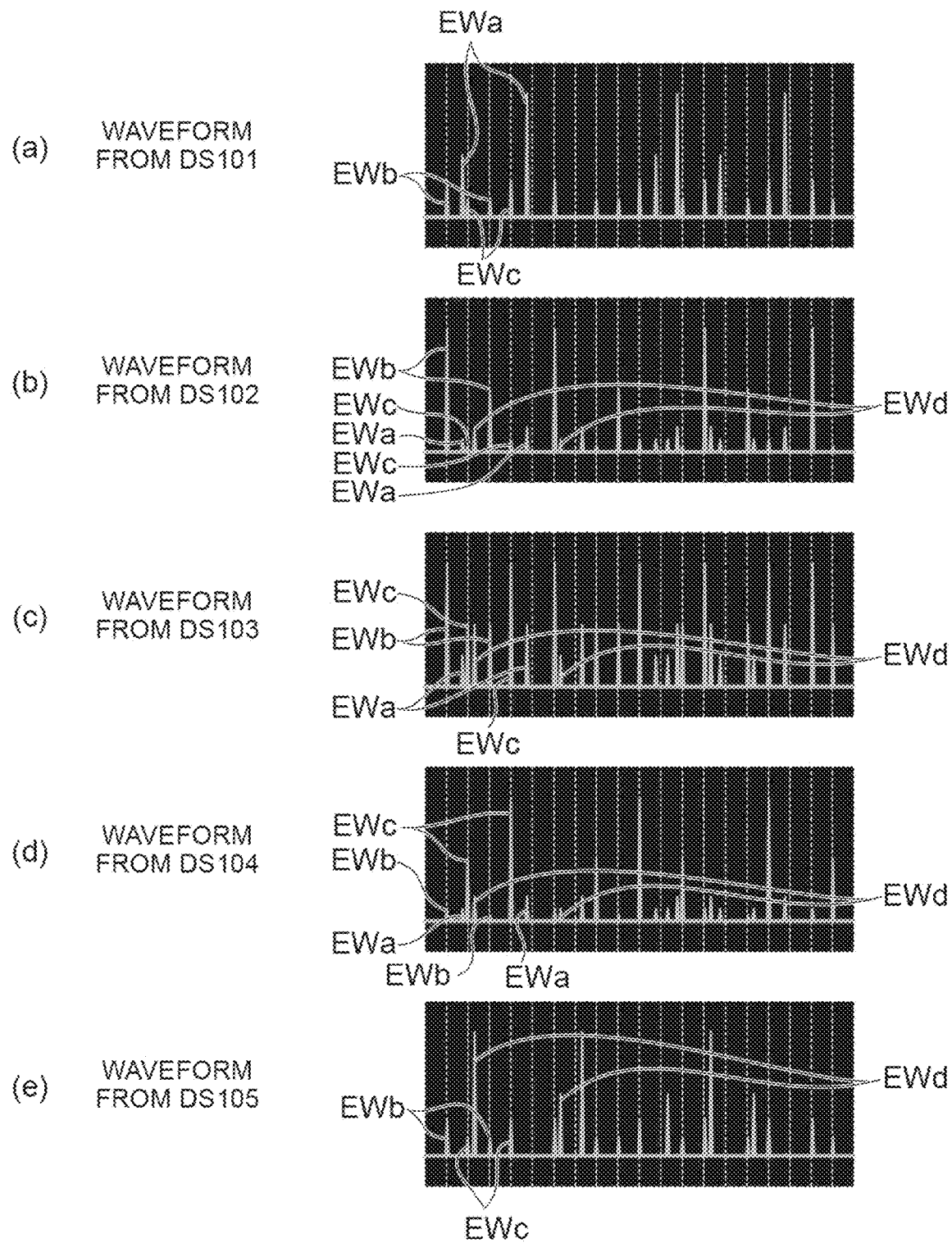
FIG. 33 is a diagram showing each light emission waveform included in the interference waveform.

FIG. 33 is a diagram showing each light emission waveform included in the interference waveform. As shown in FIG. 33($a$), the interference waveform of BS101 includes a light emission waveform of the "element a" of which the operation timing is early (hereinafter, referred to as a light emission waveform EWa of early timing), and light emission waveforms of the "element b" and the "element c" of which operation timings are normal (hereinafter, referred to as light emission waveforms EWb and EWc of medium timing). Further, as shown in FIG. 33($b$), the interference waveform of BS102 includes the light emission waveforms EWa of early timing and the light emission waveforms EWb and EWc of medium timing, and the light emission waveform of the "element d" of which the operation timing is late (hereinafter, referred to as a light emission waveform EWd of the late timing). As shown in FIG. 33($c$), the interference waveform of BS103 includes the light emission waveform EWa of early timing, the light emission waveforms EWb and EWc of medium timing, and the light emission waveform EWd of late timing. As shown in FIG. 33($d$), the interference waveform of BS104 includes the light emission waveform EWa of early timing, the light emission waveforms EWb and EWc of medium timing, and the light emission waveform EWd of late timing. As shown in FIG. 33($e$), the interference waveform of BS105 includes the light emission waveforms EWb and EWc of medium timing, and the light emission waveforms EWd of late timing.

Figure 34:
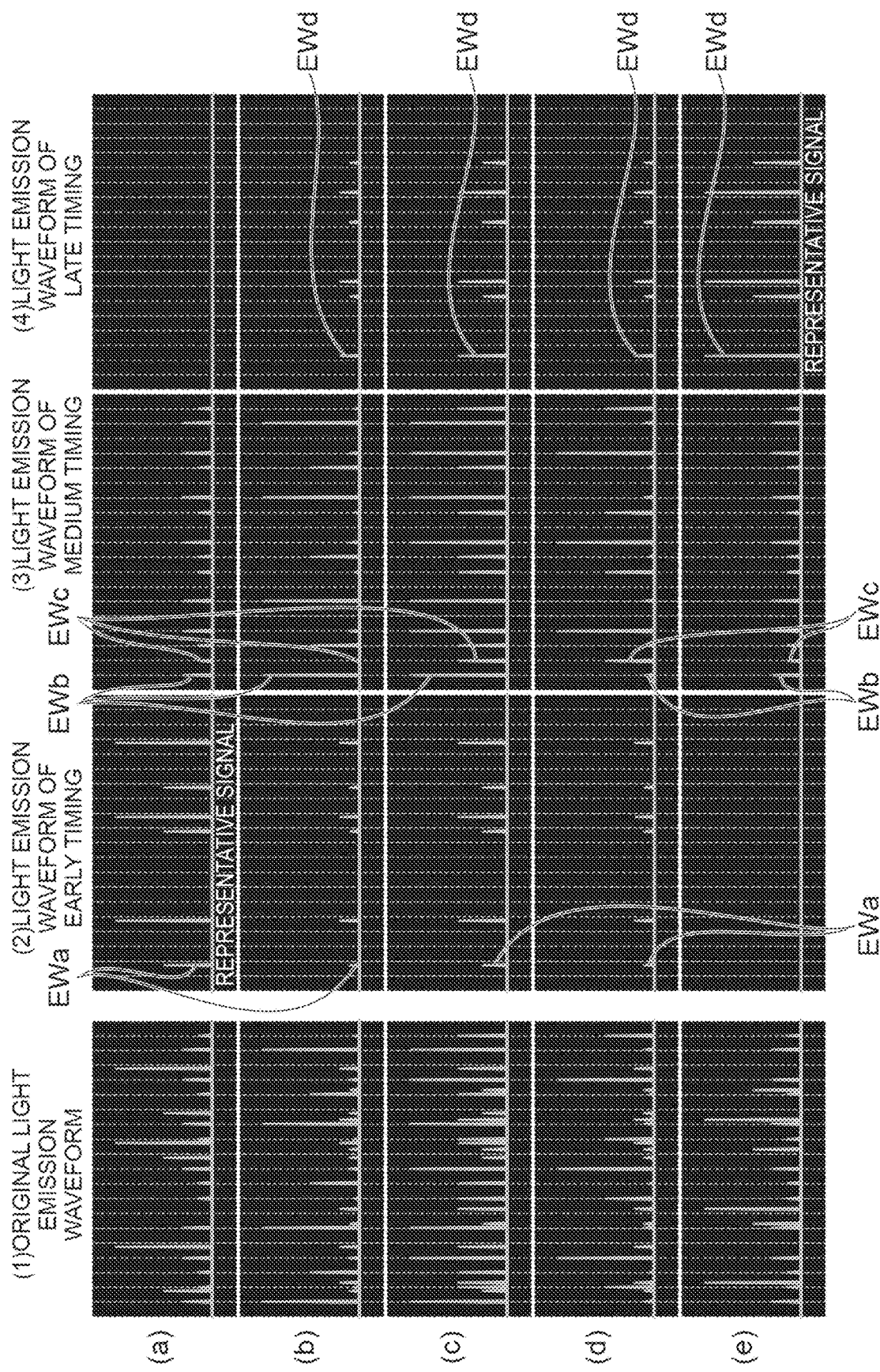
FIG. 34 is a diagram showing separation of a waveform signal based on signal timing.

FIG. 34 is a diagram showing separation of the waveform signal based on a signal timing. FIG. 34($a$) is a diagram showing a process of separating a waveform signal from the interference waveform of BS101. As shown in FIG. 34($a$), the control apparatus 20 separates the light emission waveform EWa of early timing and the light emission waveforms EWb and EWc of medium timing from the interference waveform of BS101 based on the signal timing. FIG. 34($b$) is a diagram showing a process of separating a waveform signal from the interference waveform of BS102. As shown in FIG. 34($b$), the control apparatus 20 separates the light emission waveform EWa of early timing, the light emission waveforms EWb and EWc of medium timing, and the light emission waveform EWd of late timing from the interference waveform of BS102 based on the signal timing. FIG. 34($c$) is a diagram showing a process of separating a waveform signal from the interference waveform of BS103. As shown in FIG. 34($c$), the control apparatus 20 separates the light emission waveform EWa of early timing, the light emission waveforms EWb and EWc of medium timing, and the light emission waveform EWd of late timing from the interference waveform of BS103 based on the signal timing. FIG. 34($d$) is a diagram showing a process of separating a waveform signal from the interference waveform of BS104. As shown in FIG. 34($d$), the control apparatus 20 separates the light emission waveform EWa of early timing, the light emission waveforms EWb and EWc of medium timing, and the light emission waveform EWd of late timing from the interference waveform of BS104 based on the signal timing. FIG. 34($e$) is a diagram showing a process of separating a waveform signal from the interference waveform of BS105. As shown in FIG. 34($e$), the control apparatus 20 separates the light emission waveforms EWb and EWc of medium timing and the light emission waveform EWd of late timing from the interference waveform of BS105 based on the signal timing.

Here, the light emission waveform EWa of early timing includes only the light emission waveform of the "element a". Therefore, the waveform signal of the drive element 150 represented by the "element a" can be obtained based on the light emission waveform EWa of the early timing. The control apparatus 20 reconstructs the waveform signal of the drive element 150 represented by the "element a" based on the light emission waveform EWa of early timing (refer to FIG. 34($a$)) separated from the interference waveform of the BS 101 in which the "element a" is a typical signal (refer to FIG. 35($a$)). Further, the light emission waveform EWd of late timing includes only the emission waveform of the "element d". Therefore, the waveform signal of the drive element 150 represented by the "element d" can be obtained based on the light emission waveform EWd of late timing.

The control apparatus 20 reconstructs the waveform signal of the drive element 150 represented by the "element d" based on the light emission waveform of late timing (refer to FIG. 34(e)) separated from the interference waveform of the BS 105 in which the "element d" is a typical signal (refer to FIG. 35(d)).

On the other hand, the light emission waveform of medium timing includes both the light emission waveforms of the "element b" and the "element c". Therefore, it is difficult to obtain the individual light emission waveforms of the "element b" and the "element c" only from the signal timing. The control apparatus 20 can reconstruct the waveform signals of the "element b" and the "element c" by the method described in the first embodiment (the separation of the waveform signal in consideration of the position dependence of the signal). That is, the control apparatus 20 reconstructs the waveform signal of the drive element 150 represented by the "element b" (refer to FIG. 35(b)), and reconstructs the waveform signal of the drive element 150 represented by the "element c" (refer to FIG. 35(c)) using the method described in the first embodiment. As described above, the processing of the semiconductor apparatus examination method according to the second embodiment may be performed prior to the processing of the semiconductor apparatus examination method according to the first embodiment. That is, each of the processes of the semiconductor apparatus examination method described in the first embodiment may be performed following the semiconductor apparatus examination method according to the second embodiment (along with the semiconductor apparatus examination method according to the second embodiment).

Next, operations and effects of the semiconductor apparatus examination apparatus 1 and the semiconductor apparatus examination method according to the second embodiment will be described.

The semiconductor apparatus examination method according to the present embodiment includes a step of acquiring a first interference waveform based on signals from a plurality of drive elements according to light from a first photodetection spot including the plurality of drive elements in a semiconductor apparatus 100, and a step of separating a waveform signal from the first interference waveform for each of the drive elements based on operation timings of the plurality of drive elements. In the semiconductor apparatus examination method according to the present embodiment, the first interference waveform based on the light from the first photodetection spot including the plurality of drive elements is acquired, and the waveform signal is separated from the first interference waveform for each of the drive elements based on the operation timings of the plurality of drive elements. The plurality of drive elements included in the semiconductor apparatus 100 have different operation timings according to the operation pulse signal. Therefore, the waveform signal of each of the drive elements can be appropriately separated from the first interference waveform by considering the timing (the operation timing) of the signals from the plurality of drive elements included in the first interference waveform. As described above, the semiconductor apparatus examination can be performed with high accuracy based on the waveform signal of the drive element after separation by appropriately separating the waveform signal (the original waveform) of each of the drive elements from the interference waveform.

The above-described semiconductor apparatus examination method may include a step of detecting the light from the first photodetection spot which is light emitted from the semiconductor apparatus 100 at the first photodetection spot, and the light from the second photodetection spot which is light emitted from the semiconductor apparatus 100 at the second photodetection spot. Thus, the waveform signal can be appropriately separated based on the above-described operation timing using a technique such as time resolved emission microscopy according to the light emission from the semiconductor apparatus 100, and the semiconductor apparatus examination can be performed with high accuracy.

REFERENCE SIGNS LIST

1 Semiconductor apparatus examination apparatus
11 Light source (light generation part)
16 Photodetector
20 Control apparatus (analysis part)
30 Monitor (display part)
100 Semiconductor apparatus

The invention claimed is:

1. A semiconductor apparatus examination method comprising:
    acquiring a first interference waveform based on light signals from a first plurality of elements according to light irradiation on a first spot comprising the first plurality of elements in a semiconductor apparatus, wherein the first interference waveform is a mixture of the light signals from the first plurality of elements and comprises a first wave height profile as a function of time;
    acquiring a second interference waveform based on light signals from a second plurality of elements according to light irradiation on a second spot having an overlapped region configured to partially overlap the first spot, and the overlapped region comprising a plurality of common elements, wherein the second interference waveform is a mixture of the light signals from the second plurality of elements and comprises a second wave height profile as a function of time; and
    separating a waveform signal for each of the plurality of common elements in the overlapped region based on the first interference waveform associated with the first spot and the second interference waveform associated with the second spot,
    wherein the waveform signal includes a wave height profile as a function of time, and the wave height profile of the waveform signal is determined based at least in part on the first wave height profile of the first interference waveform and the second wave height profile of the second interference waveform.

2. The semiconductor apparatus examination method according to claim 1, further comprising arranging and displaying the waveform signal after separation and a reference waveform signal of the semiconductor apparatus or a waveform signal generated by a logic simulation.

3. The semiconductor apparatus examination method according to claim 2, further comprising comparing the waveform signal after separation with the reference waveform signal of the semiconductor apparatus or the waveform signal generated by the logic simulation.

4. The semiconductor apparatus examination method according to claim 3, further comprising performing alignment between the semiconductor apparatus and a layout image of the semiconductor apparatus based on comparison results between the waveform signal after separation and the waveform signal generated by the logic simulation.

5. The semiconductor apparatus examination method according to claim 1, further comprising identifying a position of each of the plurality of common elements in the first and second spots based on the waveform signal after separation, and performing the alignment between the semiconductor apparatus and the layout image of the semiconductor apparatus based on the identified position of each of the plurality of common elements.

6. The semiconductor apparatus examination method according to claim 1, wherein a separation distance between a center of the first spot and a center of the second spot is four times or less a separation distance between gates constituting the plurality of common elements.

7. The semiconductor apparatus examination method according to claim 1, further comprising performing noise removal filtering on the first and second interference waveforms.

8. The semiconductor apparatus examination method according to claim 1, further comprising reconstructing a waveform signal at an arbitrary position in the first and second spots based on the first and second interference waveforms.

9. The semiconductor apparatus examination method according to claim 1, further comprising irradiating the first and second spots with light; and
detecting light from the first spot which is reflected light with respect to the light radiated to the first spot and light from the second spot which is the reflected light with respect to the light radiated to the second spot.

10. The semiconductor apparatus examination method according to claim 1, further comprising detecting light from the first spot which is light emitted from the semiconductor apparatus at the first spot, and light from the second spot which is light emitted from the semiconductor apparatus at the second spot.

11. A semiconductor apparatus examination apparatus comprising:
a photodetector configured to detect light from a semiconductor apparatus; and
a processor,
wherein the processor is configured to:
acquiring a first interference waveform in light detected by the photodetector based on light signals from a first plurality of elements according to light irradiation on a first spot comprising the first plurality of elements in the semiconductor apparatus, wherein the first interference waveform is a mixture of the light signals from the first plurality of elements and comprises a first wave height profile as a function of time;
acquiring a second interference waveform in light detected by the photodetector based on light signals from a second plurality of elements according to light irradiation on a second spot of which an overlapped region partially overlaps the first spot, the overlapped region comprising a plurality of common elements, wherein the second interference waveform is a mixture of the light signals from the second plurality of elements and comprises a second wave height profile as a function of time; and
separating a waveform signal for each of the plurality of common elements in the overlapped region based on the first interference waveform associated with the first spot and the second interference waveform associated with the second spot,
wherein the waveform signal includes a wave height profile as a function of time, and the wave height profile of the waveform signal is determined based at least in part on the first wave height profile of the first interference waveform and the second wave height profile of the second interference waveform.

12. The semiconductor apparatus examination apparatus according to claim 11, further comprising a display part configured to arrange and display the waveform signal after separation and a reference waveform signal of the semiconductor apparatus or a waveform signal generated by a logic simulation.

13. The semiconductor apparatus examination apparatus according to claim 12, wherein the processor is configured to further perform comparing the waveform signal after separation with the reference waveform signal of the semiconductor apparatus or the waveform signal generated by the logic simulation.

14. The semiconductor apparatus examination apparatus according to claim 13, wherein the processor is configured to further perform performing alignment between the semiconductor apparatus and a layout image of the semiconductor apparatus based on comparison results between the waveform signal after separation and the waveform signal generated by the logic simulation.

15. The semiconductor apparatus examination apparatus according to wherein the processor is configured to further perform identifying a position of each of the plurality of common elements in the first and second spots based on the waveform signal after separation, and performing the alignment between the semiconductor apparatus and the layout image of the semiconductor apparatus based on the identified position of each of the plurality of common elements.

16. The semiconductor apparatus examination apparatus according to claim 11, wherein a separation distance between a center of the first spot and a center of the second spot is four times or less a separation distance between gates constituting the plurality of common elements.

17. The semiconductor apparatus examination apparatus according to claim 11, wherein the processor is configured to further perform performing noise removal filtering on the first and second interference waveforms.

18. The semiconductor apparatus examination apparatus according to claim 11, wherein the processor is configured to further perform reconstructing a waveform signal at an arbitrary position in the first and second spots based on the first and second interference waveforms.

19. The semiconductor apparatus examination apparatus according to claim 11, further comprising a light generation part configured to generate light radiated to the first and second spots,
wherein the photodetector detects light from the first spot which is reflected light with respect to the light radiated to the first spot and light from the second spot which is the reflected light with respect to the light radiated to the second spot.

20. The semiconductor apparatus examination apparatus according to claim 11, wherein the photodetector detects light from the first spot which is light emitted from the semiconductor apparatus at the first spot, and light from the second spot which is light emitted from the semiconductor apparatus at the second spot.

* * * * *